(12) United States Patent
AbuGhazaleh

(10) Patent No.: US 10,822,838 B2
(45) Date of Patent: Nov. 3, 2020

(54) LOCKABLE COVER ASSEMBLY

(71) Applicant: Hubbell Incorporated, Shelton, CT (US)

(72) Inventor: Shadi Alex AbuGhazaleh, Guilford, CT (US)

(73) Assignee: Hubbell Incorporated, Shelton, CT (US)

(*) Notice: Subject to any disclaimer, the term of this patent is extended or adjusted under 35 U.S.C. 154(b) by 0 days.

(21) Appl. No.: 15/897,643

(22) Filed: Feb. 15, 2018

(65) Prior Publication Data
US 2018/0171674 A1 Jun. 21, 2018

Related U.S. Application Data

(62) Division of application No. 14/603,041, filed on Jan. 22, 2015, now Pat. No. 9,926,725.

(51) Int. Cl.
| | |
|---|---|
| E05B 65/00 | (2006.01) |
| H05K 5/02 | (2006.01) |
| H05K 5/03 | (2006.01) |
| H05K 7/18 | (2006.01) |
| H05K 7/14 | (2006.01) |
| E05B 73/00 | (2006.01) |

(52) U.S. Cl.
CPC ......... *E05B 65/006* (2013.01); *H05K 5/0221* (2013.01); *H05K 5/03* (2013.01); *H05K 7/1408* (2013.01); *H05K 7/1488* (2013.01); *H05K 7/186* (2013.01); *E05B 73/00* (2013.01)

(58) Field of Classification Search
CPC ...... H05K 5/0221; H05K 7/1408; H05K 5/03; H05K 7/186; H05K 7/1488; E05B 65/006; E05B 73/00

USPC ......... 211/4, 7–9, 206; 312/216, 107.5, 215, 312/222; 70/58, 159–162
See application file for complete search history.

(56) References Cited

U.S. PATENT DOCUMENTS

| | | | | | |
|---|---|---|---|---|---|
| 1,197,420 | A | * | 9/1916 | Wizorek | ............. E05D 11/1007 16/326 |
| 1,796,502 | A | * | 3/1931 | Boucher | ................. E05G 1/005 109/51 |
| 1,930,610 | A | * | 10/1933 | Despard | .................... G09F 3/18 40/642.02 |
| 2,195,223 | A | * | 3/1940 | O'Connor | ............. E05B 65/025 292/19 |

(Continued)

OTHER PUBLICATIONS

International Search Report and Written Opinion mailed in PCT/US16/12927 dated Mar. 24, 2016.

(Continued)

*Primary Examiner* — Jonathan Liu
*Assistant Examiner* — Devin K Barnett
(74) *Attorney, Agent, or Firm* — Wissing Miller LLP

(57) ABSTRACT

The present disclosure provides lockable cover assemblies that can cover mounting fasteners used to secure network devices to mounting structures, including racks, rack-mounted enclosures, cabinets or other mounting enclosures used to mount network devices, or utility boxes used to mount network devices. The lockable cover assemblies can be configured to cover the mounting fasteners of one or more network devices or the lockable cover assemblies can be built into a mounting enclosure and lock each network device in the rack.

8 Claims, 23 Drawing Sheets

(56) References Cited

U.S. PATENT DOCUMENTS

| | | | | |
|---|---|---|---|---|
| 2,673,969 A | * | 3/1954 | Pfister | H01R 25/006 439/653 |
| 2,885,723 A | * | 5/1959 | Altmann | E05D 15/502 16/232 |
| 2,938,371 A | * | 5/1960 | Check | E05B 65/5261 70/75 |
| 2,943,138 A | * | 6/1960 | Reager | H01R 13/72 174/66 |
| 3,086,830 A | * | 4/1963 | Malia | F25D 23/04 312/200 |
| 3,096,409 A | * | 7/1963 | Hubbell | H01H 3/20 174/67 |
| 3,175,873 A | * | 3/1965 | Blomquist | E05C 9/063 312/296 |
| 3,742,741 A | * | 7/1973 | Cahan | E05B 19/0005 109/52 |
| 3,975,074 A | * | 8/1976 | Fuller | H01R 25/006 439/277 |
| 4,058,994 A | * | 11/1977 | Coppola | E05B 73/0076 70/159 |
| 4,095,861 A | * | 6/1978 | Kachidurian | A47B 97/00 211/153 |
| 4,178,624 A | * | 12/1979 | Wilson | H02B 11/173 361/611 |
| 4,228,983 A | * | 10/1980 | Bowman, Jr. | E05B 73/0076 248/553 |
| 4,318,156 A | * | 3/1982 | Gallagher | H02B 1/52 307/147 |
| 4,451,101 A | * | 5/1984 | Davis | H01R 13/447 174/67 |
| 4,528,614 A | * | 7/1985 | Shariff | H02B 1/36 165/104.33 |
| 4,696,449 A | * | 9/1987 | Woo | E05B 73/0082 211/8 |
| 4,723,880 A | * | 2/1988 | Stumpf, Jr. | B60P 7/15 211/4 |
| 4,805,073 A | * | 2/1989 | Johnson | H02B 1/44 174/520 |
| 4,852,920 A | * | 8/1989 | DeForrest, Sr. | E05B 67/38 292/205 |
| 4,998,424 A | * | 3/1991 | Lambert, II | A47G 29/20 109/45 |
| 5,103,659 A | * | 4/1992 | Benefield, Sr. | A47G 29/1201 232/25 |
| D332,087 S | * | 12/1992 | Woodard | D13/177 |
| 5,243,157 A | * | 9/1993 | Hoffman | H01H 9/281 200/43.11 |
| 5,283,967 A | * | 2/1994 | Abrams | G09F 1/12 40/773 |
| 5,447,046 A | * | 9/1995 | Duffus | E05C 19/003 292/259 R |
| 5,486,650 A | * | 1/1996 | Yetter | H02G 3/10 174/53 |
| 5,555,752 A | * | 9/1996 | Fitzpatrick | E05B 47/02 200/333 |
| 5,571,023 A | * | 11/1996 | Anthony | H02G 3/14 220/242 |
| 5,594,206 A | * | 1/1997 | Klas | H01H 9/18 174/56 |
| 5,723,817 A | * | 3/1998 | Arenas | H02G 3/14 174/66 |
| 5,769,006 A | * | 6/1998 | Allaer | E05G 1/00 109/51 |
| D405,986 S | * | 2/1999 | Hoyle | D13/184 |
| 5,915,802 A | * | 6/1999 | Siler | E05B 65/467 109/47 |
| 5,977,876 A | * | 11/1999 | Coleman | A45C 13/10 340/539.1 |
| 6,053,016 A | * | 4/2000 | Young | E05B 73/0082 70/159 |
| 6,123,203 A | * | 9/2000 | Gibbons | H05K 7/1421 211/26 |
| 6,142,313 A | * | 11/2000 | Young | F41A 17/02 211/4 |
| 6,212,921 B1 | * | 4/2001 | Knighton | E05B 73/0082 248/551 |
| 6,467,640 B1 | * | 10/2002 | Hung | E05D 7/1011 174/50 |
| 6,489,565 B1 | * | 12/2002 | Krietzman | H02G 3/045 174/101 |
| 6,541,705 B1 | * | 4/2003 | McGrath | H05K 7/186 174/101 |
| 6,601,413 B1 | * | 8/2003 | Vito | E05B 67/38 70/158 |
| 6,615,992 B1 | * | 9/2003 | Lauchner | H05K 7/1489 211/175 |
| 6,705,687 B1 | * | 3/2004 | McGraw | A47F 1/06 312/50 |
| 6,842,349 B2 | * | 1/2005 | Wrycraft | H05K 5/0226 174/50 |
| 6,977,341 B1 | * | 12/2005 | Gustaveson, II | G07F 15/003 174/66 |
| 7,024,566 B2 | * | 4/2006 | Shiwaku | G06F 21/86 348/375 |
| 7,038,915 B2 | * | 5/2006 | King | H05K 7/1487 312/236 |
| 7,074,123 B2 | * | 7/2006 | Bettridge | F24F 9/00 312/236 |
| 7,104,094 B2 | * | 9/2006 | Zadak | A47F 5/0861 211/4 |
| 7,121,412 B2 | * | 10/2006 | Richards | H05K 7/186 211/26 |
| 7,188,570 B2 | * | 3/2007 | Schluter | E05C 3/24 109/23 |
| 7,255,588 B2 | * | 8/2007 | Wilder | H01R 13/6392 439/373 |
| 7,264,321 B1 | * | 9/2007 | Bueley | A47B 47/02 312/257.1 |
| 7,276,659 B2 | * | 10/2007 | Thrift | H02B 1/40 174/480 |
| 7,360,659 B1 | * | 4/2008 | Yoon | H02B 1/306 16/221 |
| 7,378,591 B2 | * | 5/2008 | Dinh | H02G 3/086 174/50 |
| 7,479,030 B2 | * | 1/2009 | Tiberio | H01R 13/748 174/66 |
| 7,525,809 B2 | * | 4/2009 | Bergmann | H01R 25/006 361/752 |
| 7,528,323 B2 | * | 5/2009 | Wu | H01R 13/72 174/66 |
| 7,561,412 B2 | * | 7/2009 | Brandt | H02B 13/025 361/616 |
| 7,815,065 B2 | * | 10/2010 | Gosche | H05K 7/186 211/85.8 |
| 7,825,333 B2 | * | 11/2010 | Puccini | H02B 1/50 174/50 |
| 7,850,013 B1 | * | 12/2010 | Kramer | E05B 73/0082 211/26 |
| 7,857,267 B2 | * | 12/2010 | Watts | H05K 7/1489 211/41.12 |
| 8,004,826 B2 | * | 8/2011 | Merkel | H02B 1/202 361/611 |
| 8,113,599 B2 | * | 2/2012 | Klassen | A47B 96/00 312/109 |
| 8,453,713 B2 | * | 6/2013 | Delia | H05K 7/20781 165/104.33 |
| 8,561,847 B2 | * | 10/2013 | Rosenkranz | A47K 5/12 137/383 |
| D692,836 S | * | 11/2013 | Thomas | D13/152 |
| 8,590,714 B1 | * | 11/2013 | Osuna-Valerio | E05B 73/00 109/50 |
| 8,633,385 B2 | * | 1/2014 | Korcz | H02G 3/088 16/282 |
| 8,680,407 B1 | * | 3/2014 | Chan | H02G 3/086 174/560 |
| D704,869 S | * | 5/2014 | Mozdzer | D26/26 |
| 8,952,252 B2 | * | 2/2015 | Bugaris | H02B 13/025 174/50 |

(56) References Cited

U.S. PATENT DOCUMENTS

| | | | | |
|---|---|---|---|---|
| 8,966,821 B2* | 3/2015 | Walker | E05D 7/1061 | 49/382 |
| 9,147,973 B1* | 9/2015 | Madison | H01R 13/6395 | |
| 9,243,431 B1* | 1/2016 | DeLeon | E05C 19/005 | |
| 9,337,596 B2* | 5/2016 | El Zakhem | H01R 25/162 | |
| 9,596,930 B2* | 3/2017 | VanHeusden | A47B 49/00 | |
| 9,653,898 B1* | 5/2017 | Deaton | H02G 3/14 | |
| 9,698,584 B2* | 7/2017 | Shotey | H02G 3/14 | |
| D795,211 S * | 8/2017 | Franck | D13/184 | |
| 10,161,165 B2* | 12/2018 | Yuan | E05B 65/52 | |
| 10,250,022 B2* | 4/2019 | Pappas | H02B 1/40 | |
| 10,276,979 B2* | 4/2019 | Cyzen | H01R 13/6395 | |
| 10,490,961 B2* | 11/2019 | Smith | H02G 3/12 | |
| 2002/0030025 A1* | 3/2002 | Sipe | A47B 81/00 | 211/4 |
| 2002/0060194 A1* | 5/2002 | Reiser | A63C 11/028 | 211/4 |
| 2002/0153814 A1* | 10/2002 | Robideau | H05K 7/183 | 312/265.4 |
| 2003/0001467 A1* | 1/2003 | Shyr | G06F 1/184 | 312/223.2 |
| 2003/0131445 A1* | 7/2003 | Padiak | E05D 5/023 | 16/309 |
| 2003/0197619 A1* | 10/2003 | Lawrence | H05K 7/1498 | 340/635 |
| 2003/0222034 A1* | 12/2003 | Champion | H05K 7/1491 | 211/26 |
| 2003/0233855 A1* | 12/2003 | Pirveysian | E05B 65/467 | 70/62 |
| 2004/0031297 A1* | 2/2004 | Winland | E05B 67/38 | 70/2 |
| 2004/0232092 A1* | 11/2004 | Cash | A47B 73/008 | 211/4 |
| 2005/0247650 A1* | 11/2005 | Vogel | H04Q 1/068 | 211/26 |
| 2005/0265004 A1* | 12/2005 | Coglitore | G06F 1/183 | 361/724 |
| 2006/0132006 A1* | 6/2006 | Schluter | H05K 5/0226 | 312/323 |
| 2006/0141921 A1* | 6/2006 | Turek | H05K 7/20572 | 454/184 |
| 2006/0156605 A1* | 7/2006 | Abrams | A47G 1/0655 | 40/781 |
| 2007/0091550 A1* | 4/2007 | Smith | H05K 7/1488 | 361/679.02 |
| 2007/0108877 A1* | 5/2007 | Bergmann | E05B 65/02 | 312/219 |
| 2008/0002358 A1* | 1/2008 | Casebolt | G06F 1/20 | 361/679.49 |
| 2008/0036344 A1* | 2/2008 | Johnson | E05B 63/244 | 312/324 |
| 2008/0283477 A1* | 11/2008 | Wamsley | A47F 3/002 | 211/4 |
| 2009/0227197 A1* | 9/2009 | Lewis, II | H05K 7/20736 | 454/284 |
| 2009/0255133 A1* | 10/2009 | Bonapace | A47G 21/14 | 30/298.4 |
| 2010/0259145 A1* | 10/2010 | Martich | H04Q 1/10 | 312/245 |
| 2010/0314166 A1* | 12/2010 | Malkowski, Jr. | H02B 1/21 | 174/72 B |
| 2011/0067896 A1* | 3/2011 | Baldwin | H02G 3/123 | 174/58 |
| 2011/0069436 A1* | 3/2011 | Jian | G06F 1/189 | 361/679.02 |
| 2011/0096485 A1* | 4/2011 | Jian | G06F 1/181 | 361/679.4 |
| 2011/0175570 A1* | 7/2011 | Lucas | H02G 3/14 | 320/109 |
| 2011/0254658 A1* | 10/2011 | Hui | E05B 7/00 | 340/5.2 |
| 2012/0069514 A1* | 3/2012 | Ross | H05K 7/20718 | 361/679.33 |
| 2012/0293932 A1* | 11/2012 | Jai | H05K 7/1491 | 361/679.02 |
| 2012/0293951 A1* | 11/2012 | Jai | H05K 7/20727 | 361/679.53 |
| 2013/0039002 A1* | 2/2013 | Li | H05K 7/1492 | 361/679.48 |
| 2013/0264026 A1* | 10/2013 | Eckberg | B23P 15/26 | 165/67 |
| 2013/0264027 A1* | 10/2013 | Eckberg | F28F 27/00 | 165/67 |
| 2014/0138336 A1* | 5/2014 | Watanabe | H05K 7/1488 | 211/183 |
| 2014/0166333 A1* | 6/2014 | Porcano | H02G 3/14 | 174/66 |
| 2014/0210323 A1* | 7/2014 | Lakoduk | H02B 1/46 | 312/223.1 |
| 2014/0308557 A1* | 10/2014 | Ebisawa | H01R 13/6315 | 429/99 |
| 2015/0167356 A1* | 6/2015 | Leyden | E05B 73/0017 | 223/85 |
| 2015/0282373 A1* | 10/2015 | AbuGhazaleh | H05K 7/18 | 312/273 |
| 2016/0135315 A1* | 5/2016 | Weber | H05K 5/0221 | 174/50 |
| 2016/0147268 A1* | 5/2016 | Wang | G06F 1/182 | 361/679.21 |
| 2017/0122014 A1* | 5/2017 | Andrasfi | E05B 15/0205 | |
| 2017/0150632 A1* | 5/2017 | Merrell | H04Q 1/09 | |
| 2017/0347480 A1* | 11/2017 | Bold | H05K 7/1489 | |
| 2017/0350161 A1* | 12/2017 | Fink | E05B 1/003 | |
| 2018/0303005 A1* | 10/2018 | Besterman | H05K 7/1489 | |
| 2018/0338380 A1* | 11/2018 | Yeh | H05K 5/0208 | |

OTHER PUBLICATIONS

Product Pamphlet Pages—2012 Cooper B-Line, Inc., CDRSP_12. Rack Security Products, 6 pages.

Product Pamphlet Pages—Cooper B-Line, Inc., Patch Panel Protector ERA, Rack Security Products, pp. 29-33.

Product Pamphlet pages, 2004-2012, Pathways & Spaces, Inc., 2 pages.

Secure Patch Security Cover, Pathways & Spaces, Inc. Instruction sheet, Oct. 31, 2009, 2 pages.

Installation Instructions Kit PIN: 124-2247, 4 Post 2 U Secure Serve Unit, pp. 1-8.

* cited by examiner

LOCKABLE COVER ASSEMBLY

CROSS-REFERENCE TO RELATED APPLICATIONS

This application is a divisional of application Ser. No. 14/603,041, filed Jan. 22, 2015, entitled "Lockable Cover Assembly" which is incorporated herein in its entirety by reference.

BACKGROUND

Field

The present disclosure relates generally to securing network infrastructures, and more particularly to racks, enclosures and other mounting structures for mounting network devices, and lockable cover assemblies used to secure the network devices to the mounting structures.

Description of the Related Art

Data centers, telecommunication rooms house network infrastructure components and network devices, such as switches, routers, servers, storage devices, patch panels, and other electronic equipment, installed on racks, in enclosures or cabinets or other mounting structures. Referring to FIGS. 1 and 2, a rack 10 is generally a metal frame used to mount network devices, and resemble a shelving structure where network devices can be attached to the rack vertically and stacked one top of one another. Generally, individual network devices are screwed onto a front surface 12 of the rack 10, which has tapped holes 14 spaced apart to accommodate network devices having various heights. The standard unit of measure for designating the vertical usable space in a rack, or the height of racks, is the letter "U" preceded by a whole number. This unit of measurement refers to the space between shelves on a rack. For example and referring to FIG. 2, a 1 U network device has 1 rack space for network equipment, and has 1.75 inches of vertical usable space. As another example, a rack designated as 4 U has 4 rack spaces for network equipment and has 7 inches of vertical usable space. Rack spaces and the network devices that fit into them are all measured in "U". While racks come in many different heights, the standard width size rack is 19 inches.

Physical network device security has been a growing area of concern for data center operators and vendors alike. The concerns vary from simple protection of the network equipment from occasional tampering, to fully securing the network equipment from all undesired access and any type of tampering, sabotage, theft or other action that can cause disruption to the network.

Racks are typically placed in secured rooms as a first line of security to limit access to or unauthorized removal of the network infrastructure components and devices. A rack refers specifically to the frame that provides a structure for mounting the network equipment. A second line of security is typically the utilization of rack-mounted enclosures that restrict access to the network devices and their mounting points within the security enclosure. A third line of security is cabinets. Referring to FIG. 3, a cabinet 16 is a rack fitted with a door 18 and side panels 20. Cabinets secure the network devices by restricting access to every network device within the cabinet 16 when the door 18 is locked. Rack mounted enclosures and cabinets work well when the desire is to restrict access to all network devices within the enclosure or cabinet, and when there is sufficient space for the enclosure or cabinet within the installation area. However, in many instances restricting access to all network devices within a cabinet is not practical or required. For example, many potential service personnel from many different vendors may need access to the data center and the network equipment to conduct testing and provide repair services. Unlocking cabinet 16 to allow various service personnel to work on a single network device exposes all network devices within the cabinet to theft. Further, the addition of cabinets adds more complexity for such testing and repair service personnel in terms of limited access to the interior of the cabinet, which increases service times and costs. Further, the cost of the cabinets and the additional space requirements increases the overall cost of the installation. There are also cases within a cabinet or an enclosure where multiple user access is granted and there is a need to further secure certain high-value or high-risk components.

SUMMARY

The present disclosure provides lockable cover assemblies that can cover mounting fasteners used to secure network devices to mounting structures, including racks, rack-mounted enclosures, cabinets or other mounting enclosures used to mount network devices, or utility boxes used to mount network devices. The lockable cover assemblies can be configured to cover the mounting fasteners of one or more network devices or the lockable cover assemblies can be built into the mounting structure and lock each network device in the mounting structure.

In an exemplary embodiment of a lockable cover assembly according to the present disclosure, the lockable cover assembly includes a body having a rear wall configured to facilitate the mounting of the body to a rack or mounting structure, and a cover coupled to the body so that the cover is movable between open and closed positions. The cover may be coupled to the body with a hinge, or the cover can be coupled to the body using a hinge arm extending form the cover that is configured to fit within a slot in the body, or other suitable mechanism. The cover has a locking assembly capable of engaging the body to lock the cover to the body. The cover and body when in the closed position form an enclosure preventing access to an interior of the body, and when locked prevent access network device mounting screws within the interior of the body.

The lockable cover assembly can be configured and dimensioned to cover one or more fasteners used to secure a single network device to a rack or mounting structure, or one or more fasteners used to secure a plurality of network devices to the rack or mounting structure. The cover and body can be configured and dimensioned to cover the network devices in an overlay position or a straddle position. In the overlay position, the cover and body sit on one or more network devices and are secured to the mounting structure such that the cover and body are to be removed in order to remove the network devices. In the straddle position, the cover and body straddle the network devices, such that the network devices can be removed without removing the cover and body from the mounting structure.

In another exemplary embodiment of the lockable cover assembly according to the present disclosure, the lockable cover assembly includes a cover movably secured to a front surface of the mounting structure, such that the cover is movable between open and closed positions. The cover has a locking assembly capable of engaging the front surface of the rack to lock the cover to the mounting structure.

BRIEF DESCRIPTION OF THE DRAWINGS

The figures depict embodiments for purposes of illustration only. One skilled in the art will readily recognize from the following description that alternative embodiments of the structures illustrated herein may be employed without departing from the principles described herein, wherein.

DETAILED DESCRIPTION

Figure 1:
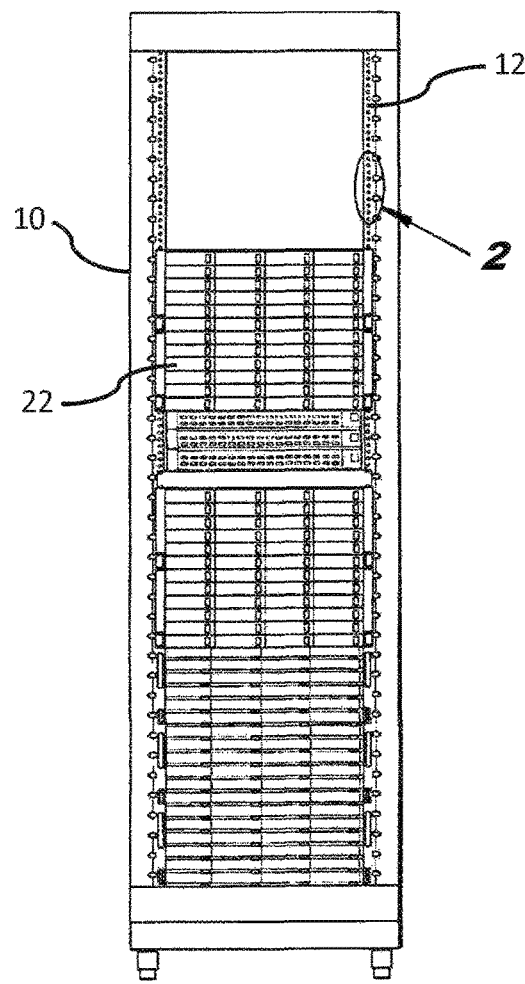
FIG. 1 is a front plan view of a rack used to house network devices.

The present disclosure provides lockable cover assemblies that can cover mounting fasteners used to secure network devices to a mounting structure, such as to a rack or within a rack-mounted enclosure, a cabinet or other mounting enclosure used to mount network devices, or within a utility box used to mount network devices. The lockable cover assemblies can be configured to cover the mounting fasteners of one or more network devices. While the embodiments of the lockable cover assembly disclosed herein show an assembly that is substantially rectangular in shape, the lockable cover assembly can come in many shapes and sizes without departing from the scope of the present disclosure. Further, while the embodiments of the lockable cover assembly disclosed herein are shown secured to a rack, the present disclosure contemplates using the lockable cover assembly within other mounting structures, such as a rack-mounted enclosure, a cabinet or other mounting enclosure used to mount network devices, or within a utility box used to mount network devices.

Referring to FIGS. 4-7, the lockable cover assembly 30 includes a body 32 and a cover 34. The body 32 has a first side wall 40, a top wall 42, a bottom wall 44, a rear wall 46 having an elongated section 46a, an upper section 46b and a lower section 46c configured to form a channel 48 defined by height "H3" and width "W1" (seen in FIG. 7), and side wall sections 50a and 50b. In some embodiments, the rear wall 46 may be a full wall without channel 48.

Figure 7:
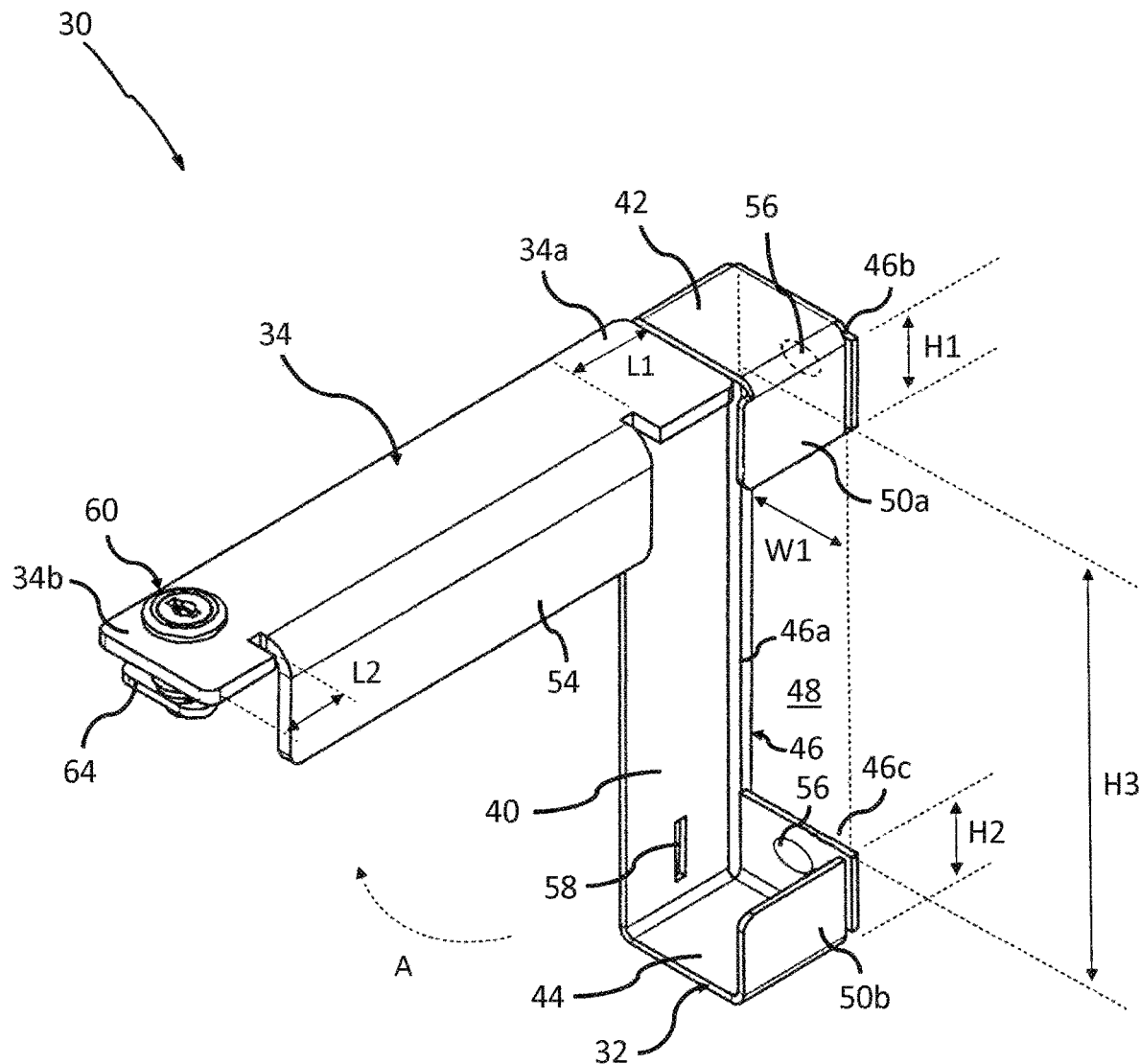
FIG. 7 is a left side perspective view of the lockable cover assembly of FIG. 5 with the cover in an open position.

The cover 34 is secured to the body 32 with a hinge 52 preferably secured to a upper section 34a of cover 34 and the top wall 42 of body 32, such that the cover 34 can pivot in the direction of arrow "A" when opening the cover. The upper section 34a of cover 34 is preferably substantially similar in length "L1" as the height "H1" of side wall section 50a, and the lower section of 34b of cover 34 is preferably similar in length "L2" as the height "H2" of side wall section 50b. The cover 34 also includes an overlay wall 54 that is configured to fit between side wall sections 50a and 50b, as can be seen in FIG. 7. In this configuration, the body 32 and cover 34 when closed form an enclosure preventing access to the interior of body 32.

Each rear wall section 46b and 46c of body 34 includes a mounting aperture 56 for mounting the lockable cover assembly 30 to a rack. The mounting apertures 56 are positioned to align with threaded holes in a rack, as will be described in more detail below. The cover 34 includes a lock assembly 60 that has a lock cylinder 62 and a latch 64. The lock assembly 60 can be any conventional keyed lock assembly or other type of lock assembly. In the exemplary embodiment shown, the latch 64 of lock assembly 60 is positioned on the cover 34 so that the latch 64 engages slot 58 in body 32.

Figure 2:
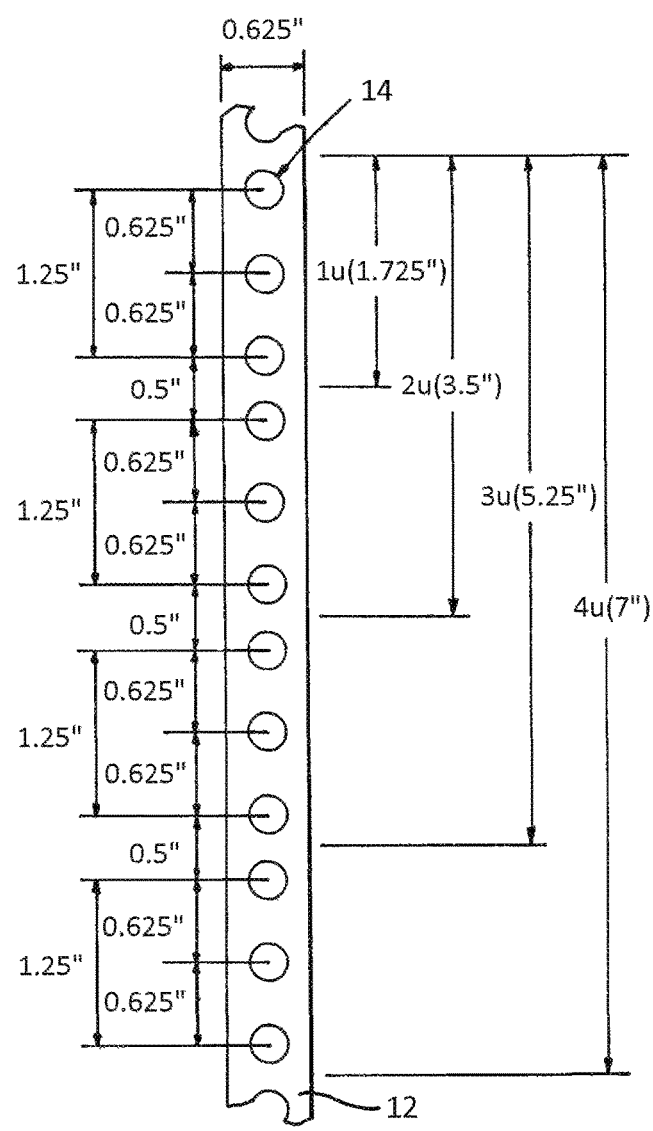
FIG. 2 is an exploded view of a portion of the rack of FIG. 1, illustrating a portion of a front surface of the rack with tapped holes.
Figure 3:
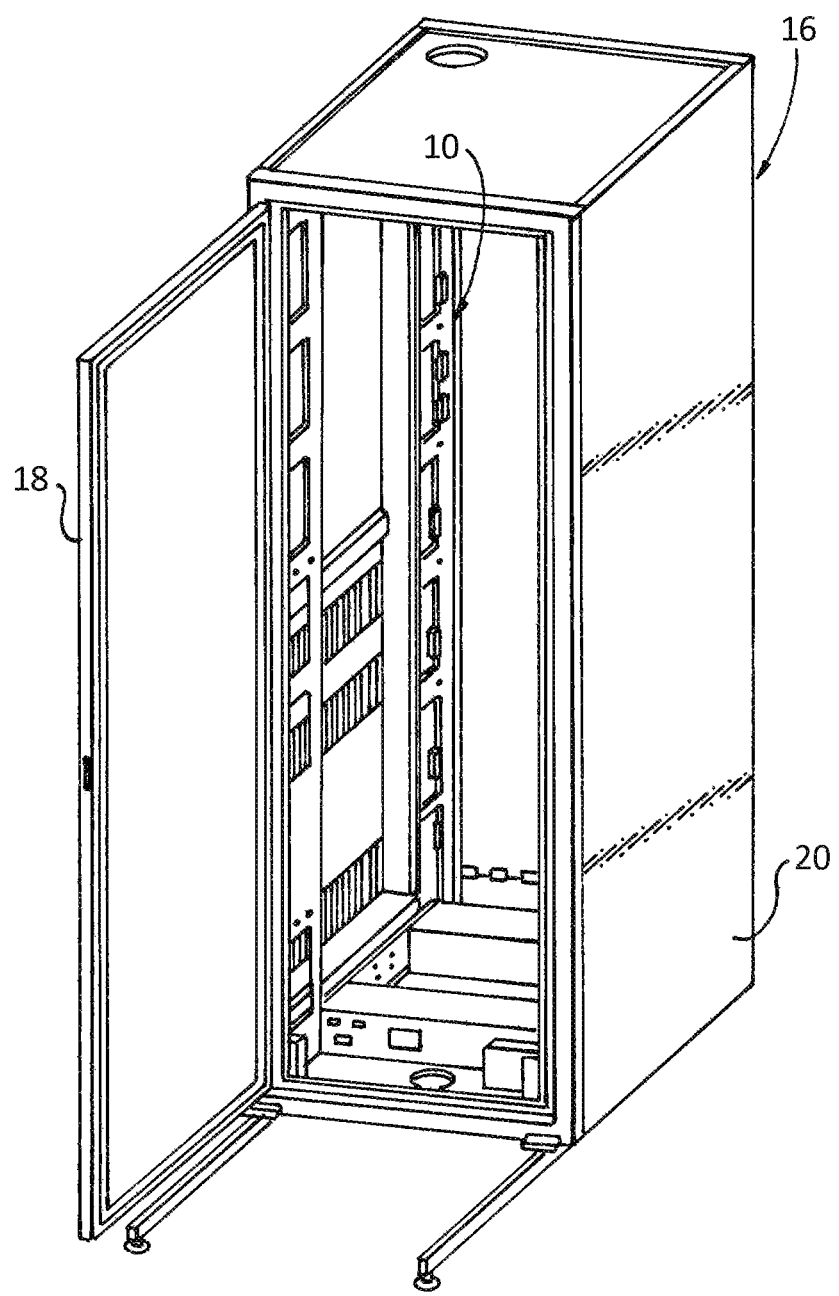
FIG. 3 is a perspective view of a cabinet used to house network devices.
Figure 4:
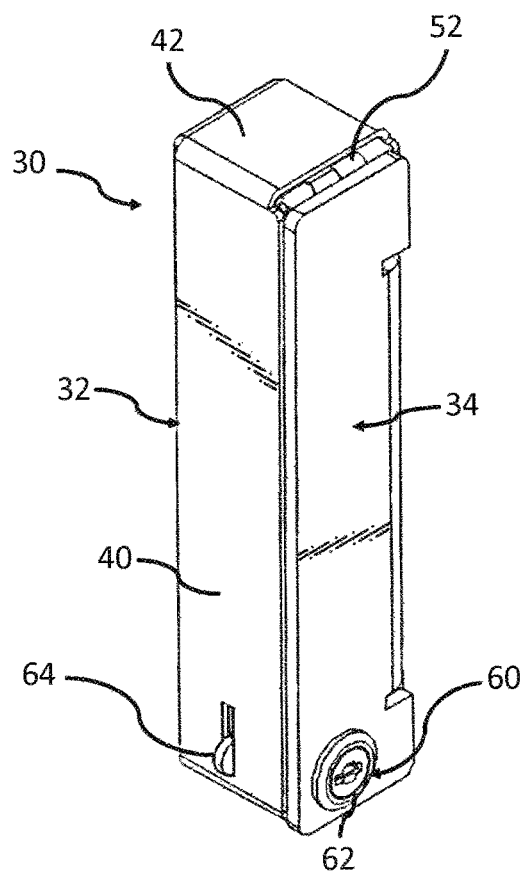
FIG. 4 is a right side perspective view of an exemplary embodiment of a lockable cover assembly according to the present disclosure.
Figure 5:
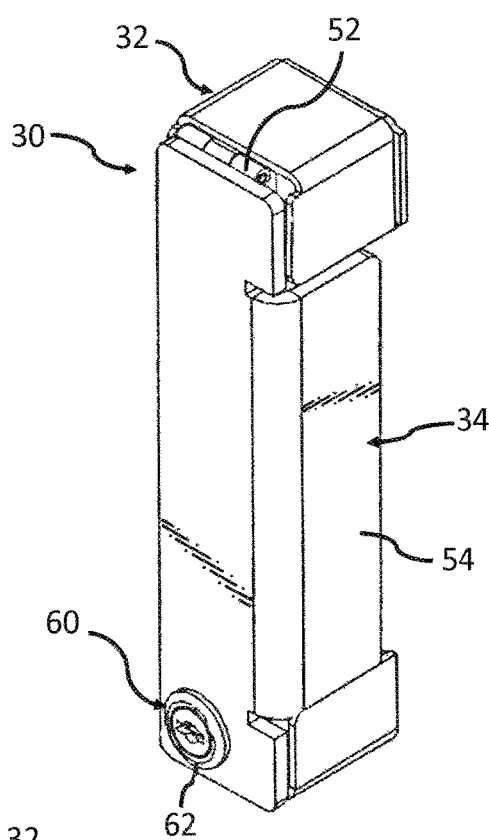
FIG. 5 is a left side perspective view of the lockable cover assembly of FIG. 4 with a cover in a closed position.
Figure 6:
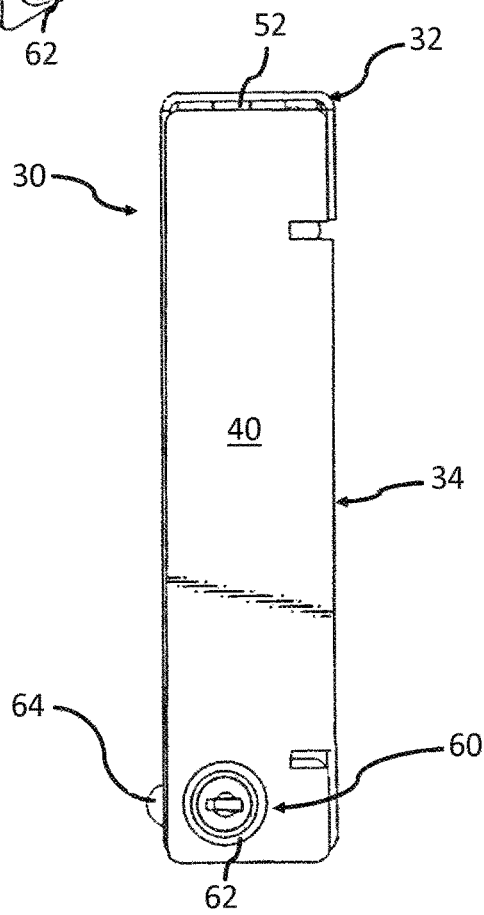
FIG. 6 is a plan view of the lockable cover assembly of FIG. 4.

Referring to FIGS. 8-13, the length of the lockable cover assembly 30 may vary in size. As noted above, each side of a rack face has a number of threaded holes 14 spaced apart at standardized intervals representing rack units, where a whole number is followed by the letter "U". For example, a 2 U rack unit represents a spacing of 3.5 inches occupied by a network device and corresponding set of six threaded holes spaced apart within the 3.5 spacing, as seen in FIG. 2. As another example, a 4 U rack unit represents a spacing of 7 inches occupied by a network device and corresponding set of twelve threaded holes spaced apart within the 7 spacing, as seen in FIG. 2. With this in mind, the lockable cover assembly 30 length can be configured to cover the mounting fasteners of a single network device installed in the rack, or the mounting fasteners of a plurality of network devices installed in a rack.

Figure 8:
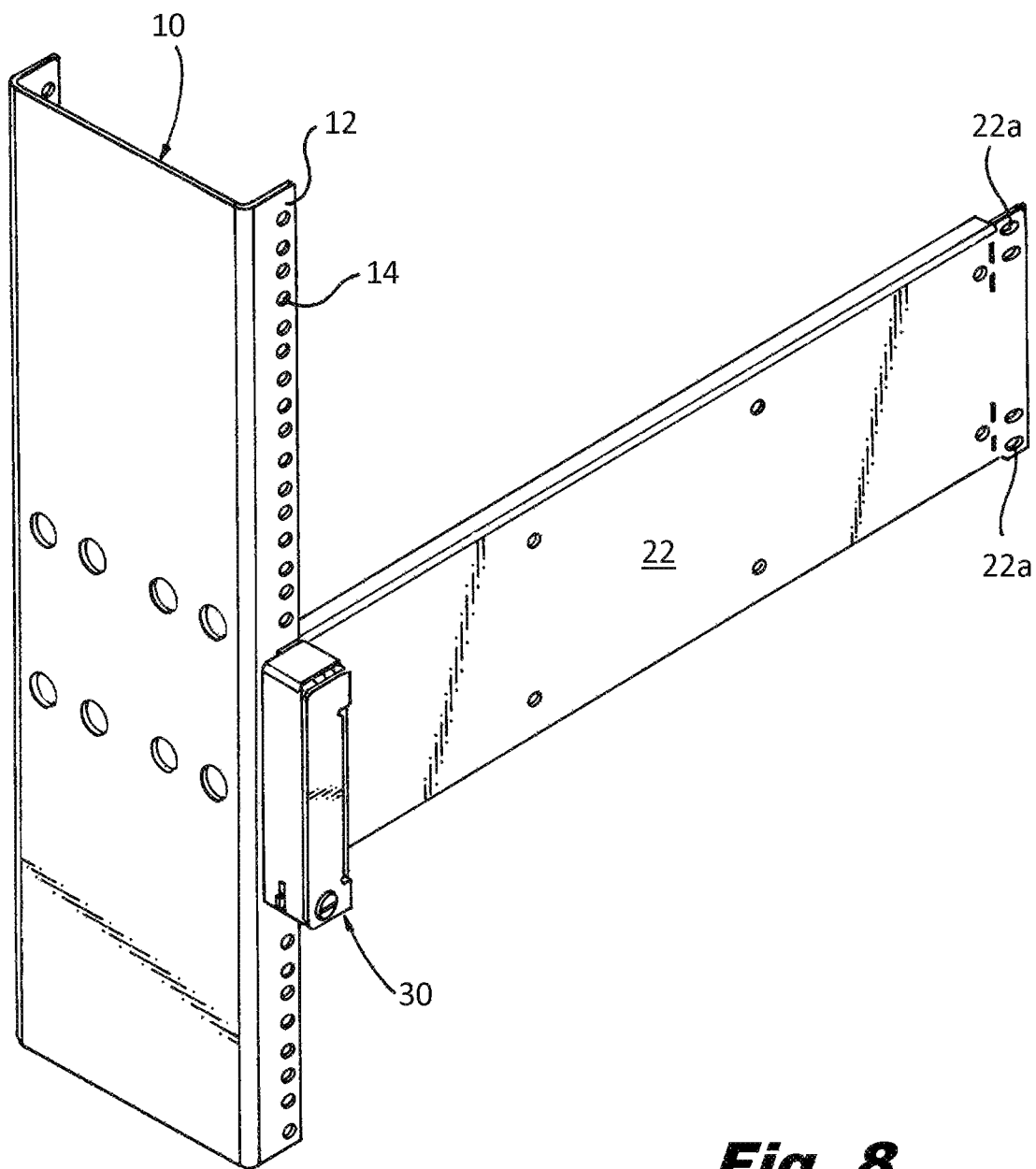
FIG. 8 is a right side perspective view of the lockable cover assembly of FIG. 4 mounted to a mounting structure in a position overlaying a network device.
Figure 9:
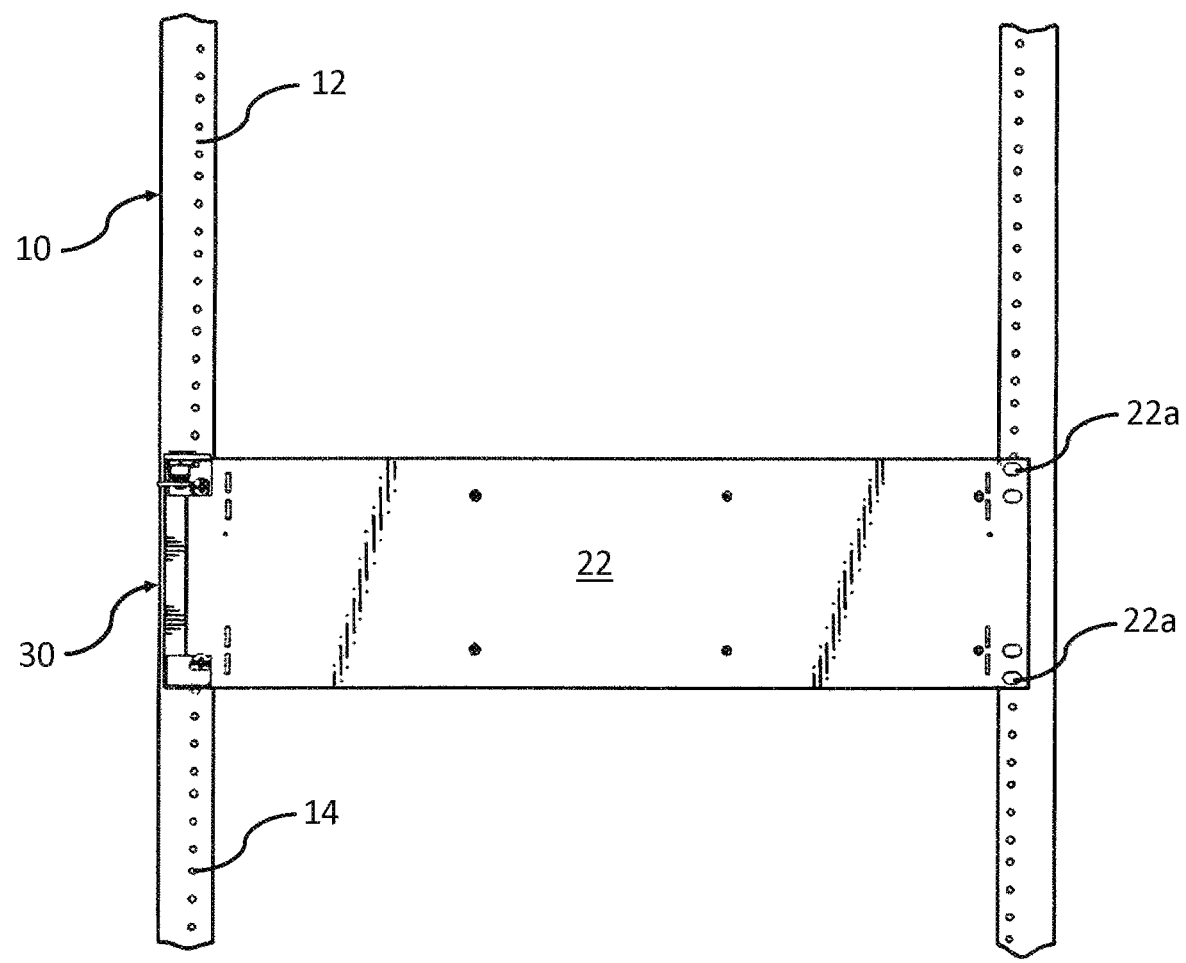
FIG. 9 is a front plan view of the lockable cover assembly of FIG. 4 with the cover in the closed position mounted to a mounting structure in a position overlaying a network device.
Figure 10:
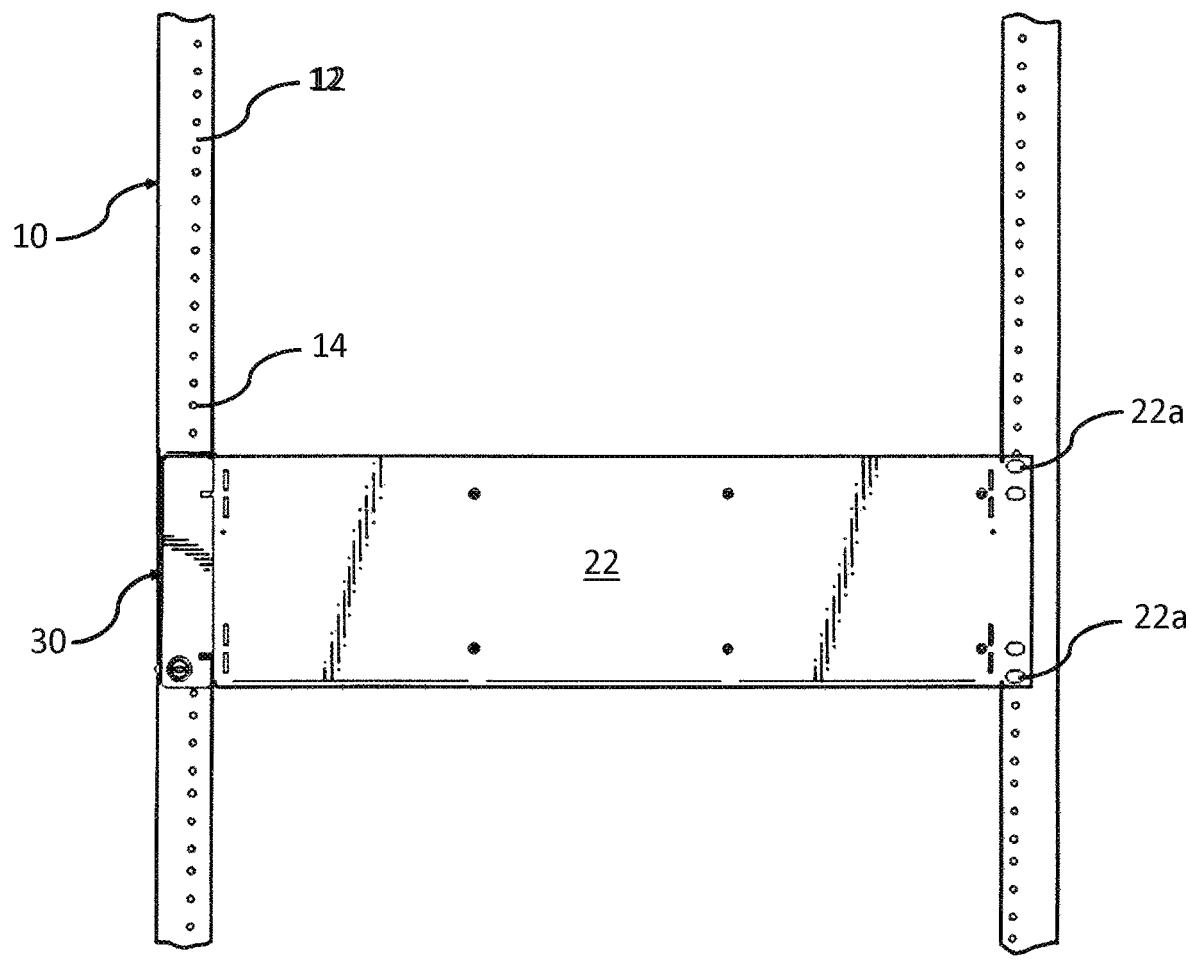
FIG. 10 is a front plan view of the lockable cover assembly of FIG. 4 with the cover in the open position and mounted to a mounting structure in a position overlaying a network device.

Referring FIGS. 8-10, the lockable cover assembly 30 is configured to cover the mounting fasteners of a single network device. In this configuration, the body 32 of the lockable cover assembly 30 is in an overlay mounting position where the lockable cover assembly 30 sits on top of the network device 22, such that the mounting apertures 56 align with mounting apertures 22a in the network device 22. In FIG. 9, the cover 34 is in an open position. As can be seen, the rear wall sections 46b and 46c sit on top of the network device 22 such that the mounting apertures 56 align with the mounting apertures 22a in the network device and the lockable cover assembly 30 is secured to the rack 10 via screws that pass through the apertures 22a and 56 and into threaded holes 14 in the front surface 12 of the rack 10. By pivoting the cover 34 to the closed position and locking the assembly 60, seen in FIG. 10, the screws securing the network device 22 to the rack 10 are covered and not accessible.

Figure 11:
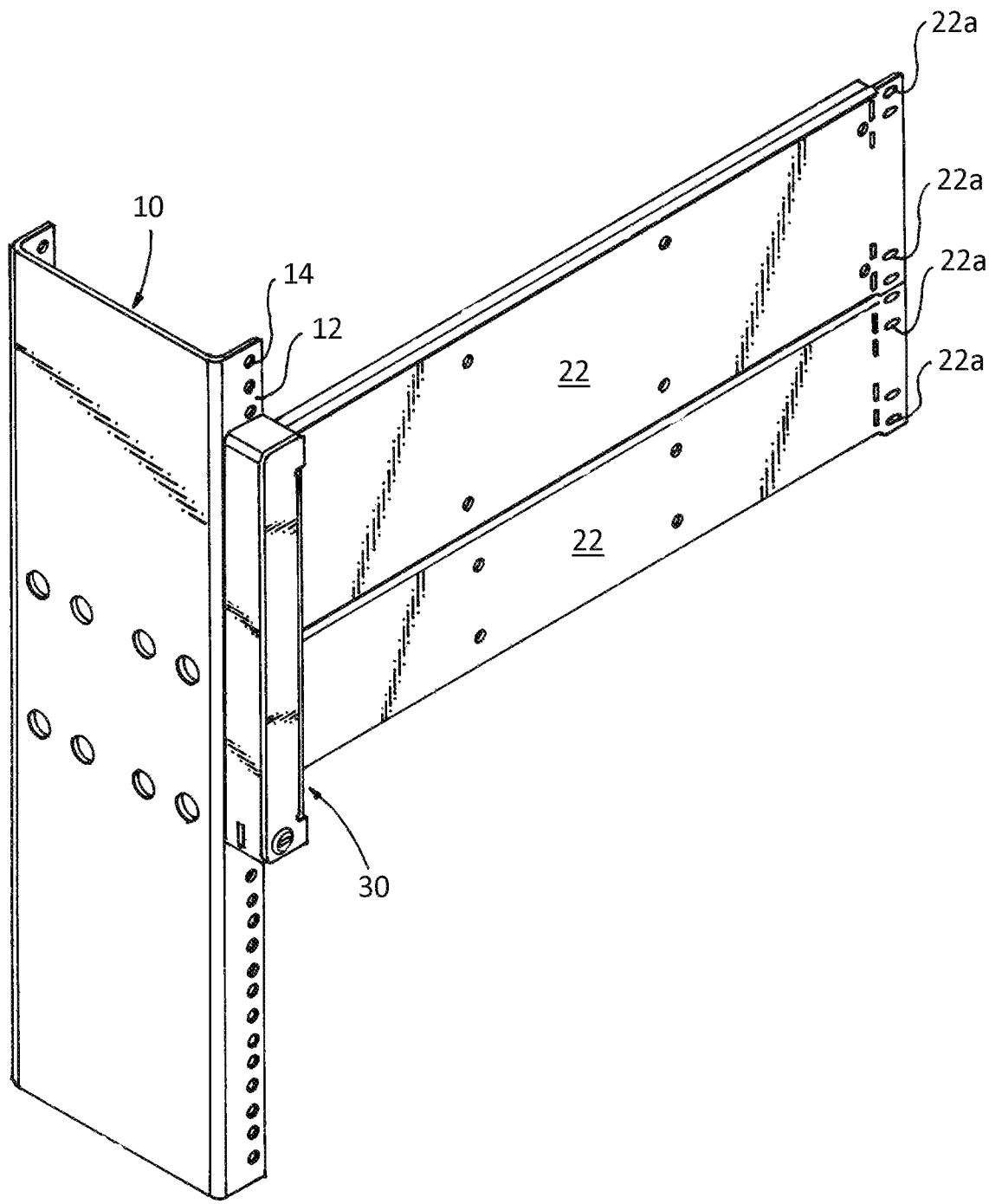
FIG. 11 is a right side perspective view of the lockable cover assembly of FIG. 4 configured for multiple network devices and mounted to a mounting structure in a position straddling the network devices.
Figure 12:
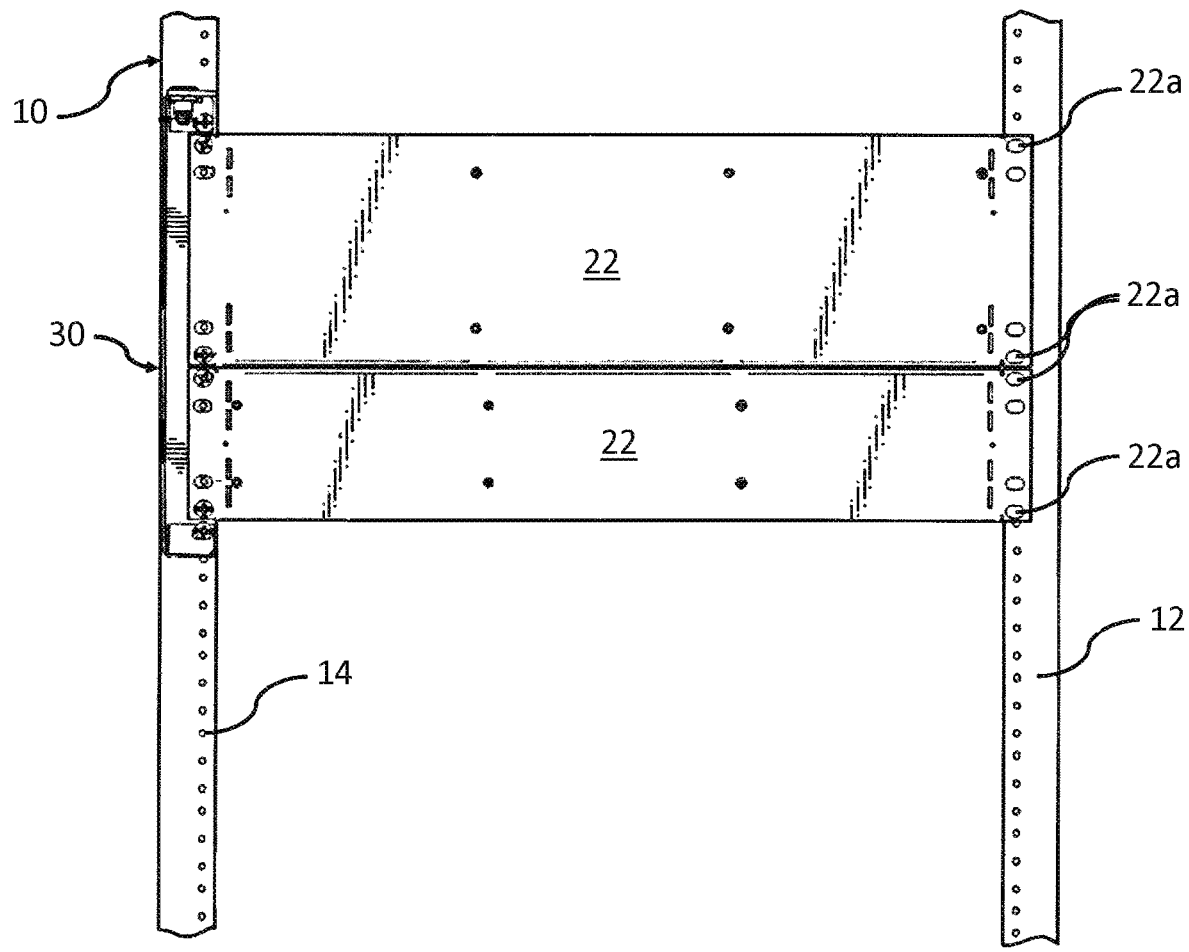
FIG. 12 is a front plan view of the lockable cover assembly of FIG. 4 configured for multiple network devices, with the cover in the closed position and mounted to a mounting structure in a position straddling the network devices.
Figure 13:
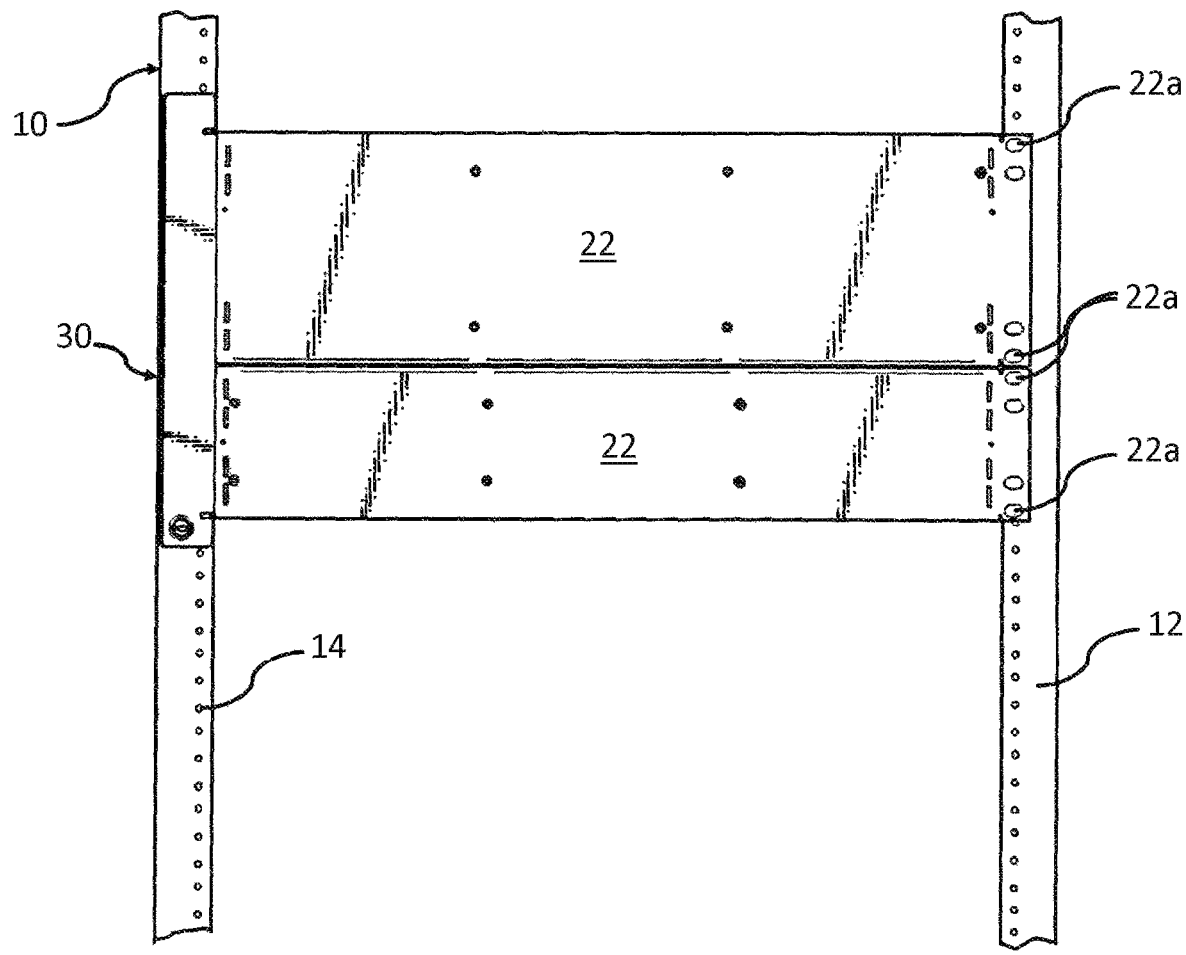
FIG. 13 is a front plan view of the lockable cover assembly of FIG. 4 configured for multiple network devices, with the cover in the open position and mounted to a mounting structure in a position straddling the network devices.
Figure 14:
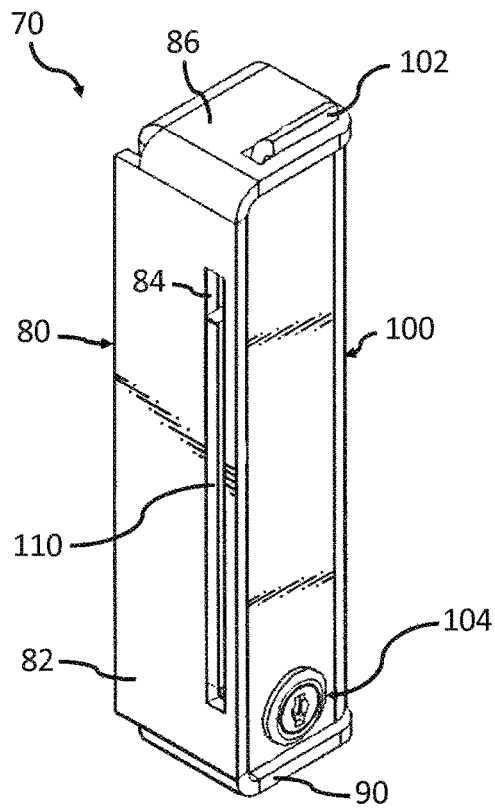
FIG. 14 is a perspective view of another exemplary embodiment of a lockable cover assembly according to the present disclosure.
Figure 15:
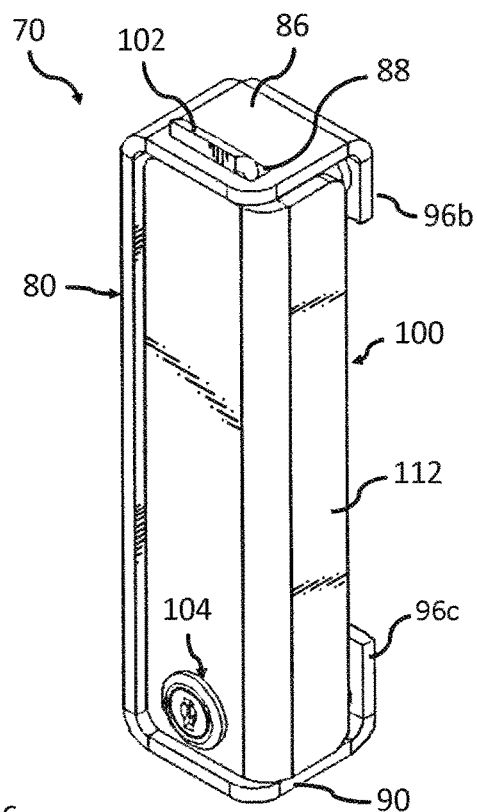
FIG. 15 is a perspective view of the lockable cover assembly of FIG. 14 with a cover in a closed position.
Figure 16:
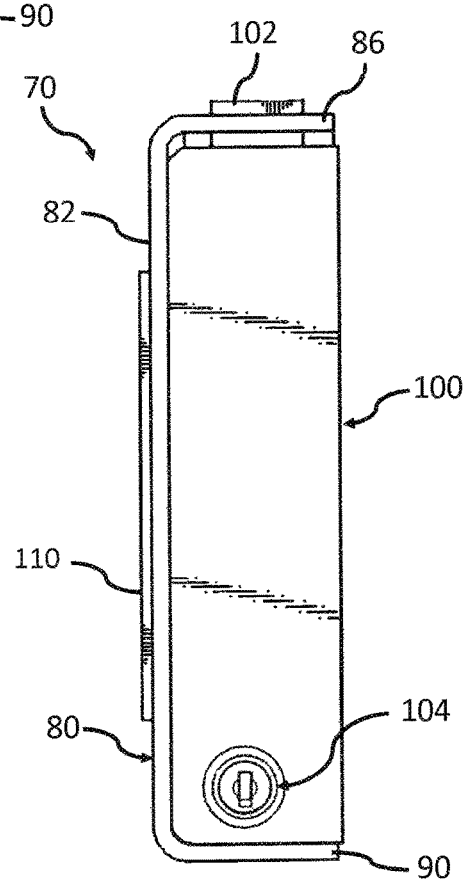
FIG. 16 is a plan view of the lockable cover assembly of FIG. 14.
Figure 17:
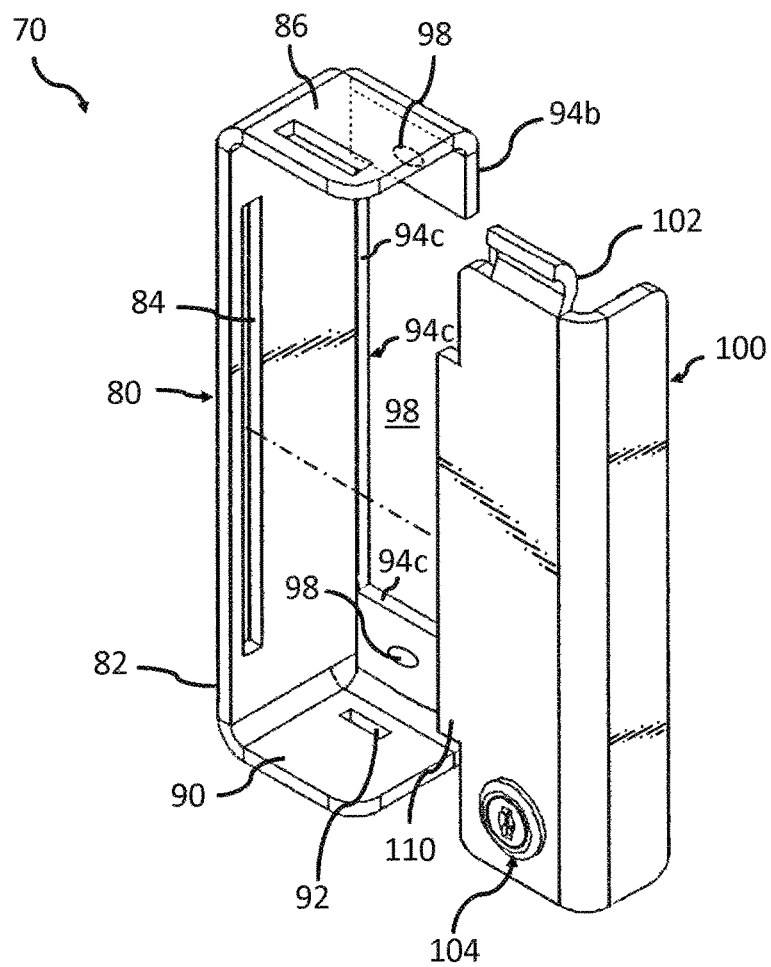
FIG. 17 is a perspective view of the lockable cover assembly of FIG. 14 with the cover in an open position.
Figure 18:
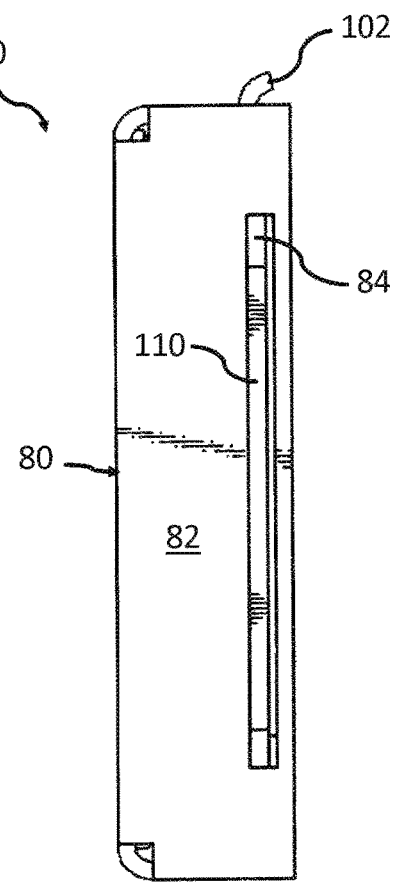
FIG. 18 is a side view of the lockable cover assembly of FIG. 14.
Figure 19:
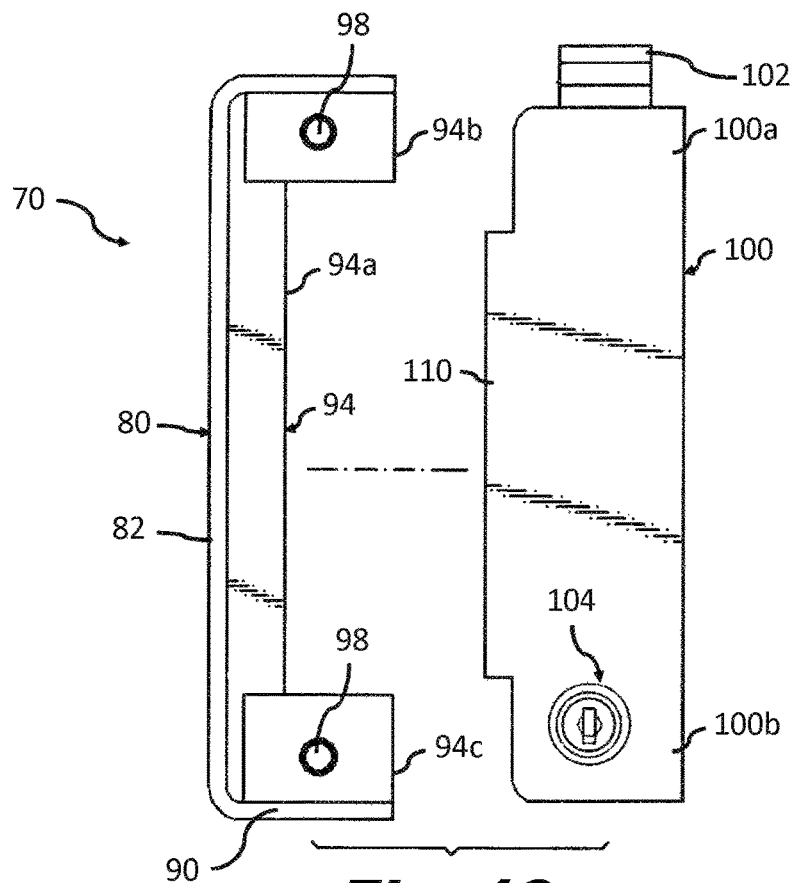
FIG. 19 is a plan view of the lockable cover assembly of FIG. 14 with a cover in an open position.
Figure 20:
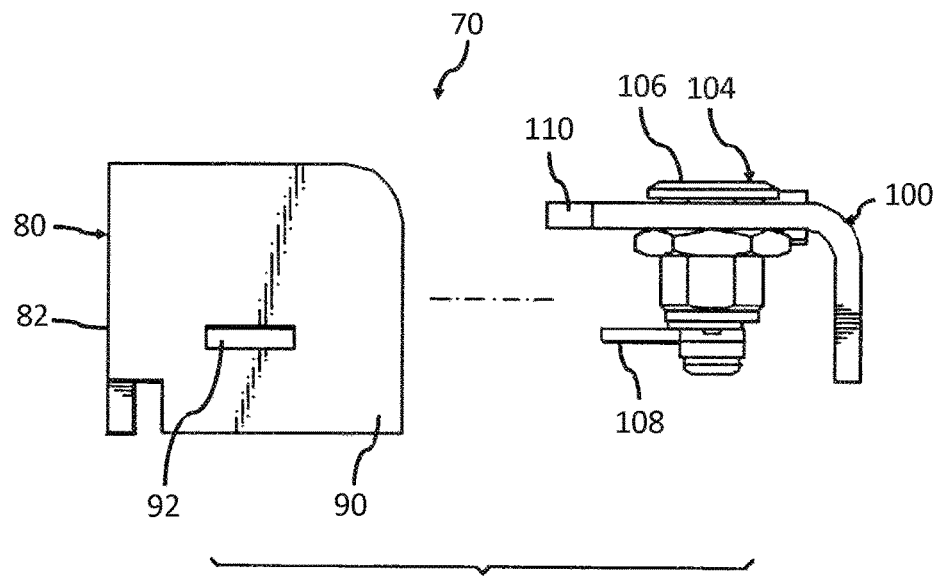
FIG. 20 is a bottom elevation view of the lockable cover assembly of FIG. 14.

Turning to FIGS. 11-13, the lockable cover assembly 30 is configured to cover the mounting fasteners of multiple network devices 22. In this configuration, the body 32 of the lockable cover assembly 30 is in a straddle mounting position where the lockable cover assembly 30 sits over and straddles the network devices 22, as seen in FIG. 12. In a straddle mounting position, the mounting apertures 56 align with threaded holes 14 in rack 10. In FIG. 12, the cover 34 is in an open position. As can be seen, the network devices 22 sit within channel 48 of rear wall 46, and the mounting apertures 56 in rear wall sections 46b and 46c align with threaded holes 14 in the rack front 12. The lockable cover assembly 30 can then be secured to the rack 10 via screws that pass through the apertures 56 and into threaded holes 14. In embodiments where the lockable cover assembly 30 is configured for straddle mounting, the channel 48 in the rear wall is configured and dimensioned to receive a mounting surface of one or more network devices 22. By pivoting the cover 34 to the closed position and locking the assembly 60, seen in FIG. 13, the screws securing the network device 22 to the rack are covered and not accessible.

Referring to FIGS. 14-20, another exemplary embodiment of a lockable cover assembly is shown. In this exemplary embodiment, the lockable cover assembly 70 includes a body 80 and a cover 100. The body 80 has side wall 82 having an interlock slot 84, a top wall 86 having a hinge slot 88, a bottom wall 90 having a latch slot 92, and a rear wall 94 that has an elongated section 94a, an upper section 94b, and a lower section 94c configured to form a channel 96. The upper and lower sections 94b and 94c have mounting holes 98 for mounting the lockable cover assembly 70 to a rack.

The cover 100 has an upper section 100a and a lower section 100b. The upper section 100a has a hinge arm 102 configured to fit within hinge slot 88 in body 80. The lower section 100b has a lock assembly 104 that includes a lock cylinder 106 and a latch 108. The lock assembly can be any conventional keyed lock assembly or other type of lock assembly. In the exemplary embodiment shown, the latch 108 of lock assembly 104 is positioned on the cover 100 so that the latch 108 engages latch slot 92 in body 80. The face of the cover 100 has an interlock arm 110 configured to fit within interlock slot 84 in side wall 82. The cover 100 has an overlay wall 112 that extends from the top wall 88 of body 80 to the bottom wall 90 of the body. In this configuration, the body 80 and cover 100 when closed form an enclosure preventing access to the interior of body 80.

As noted above, the lockable cover assembly according the present disclosure can be configured to receive the mounting surfaces of a network device and cover the mounting fasteners used to secure the network device to the rack. In another embodiment, the lockable cover assembly can be configured to fit over the network device and using the same fasteners as those used to mount the device to the rack also mount the cover assembly to the rack.

Figure 21:
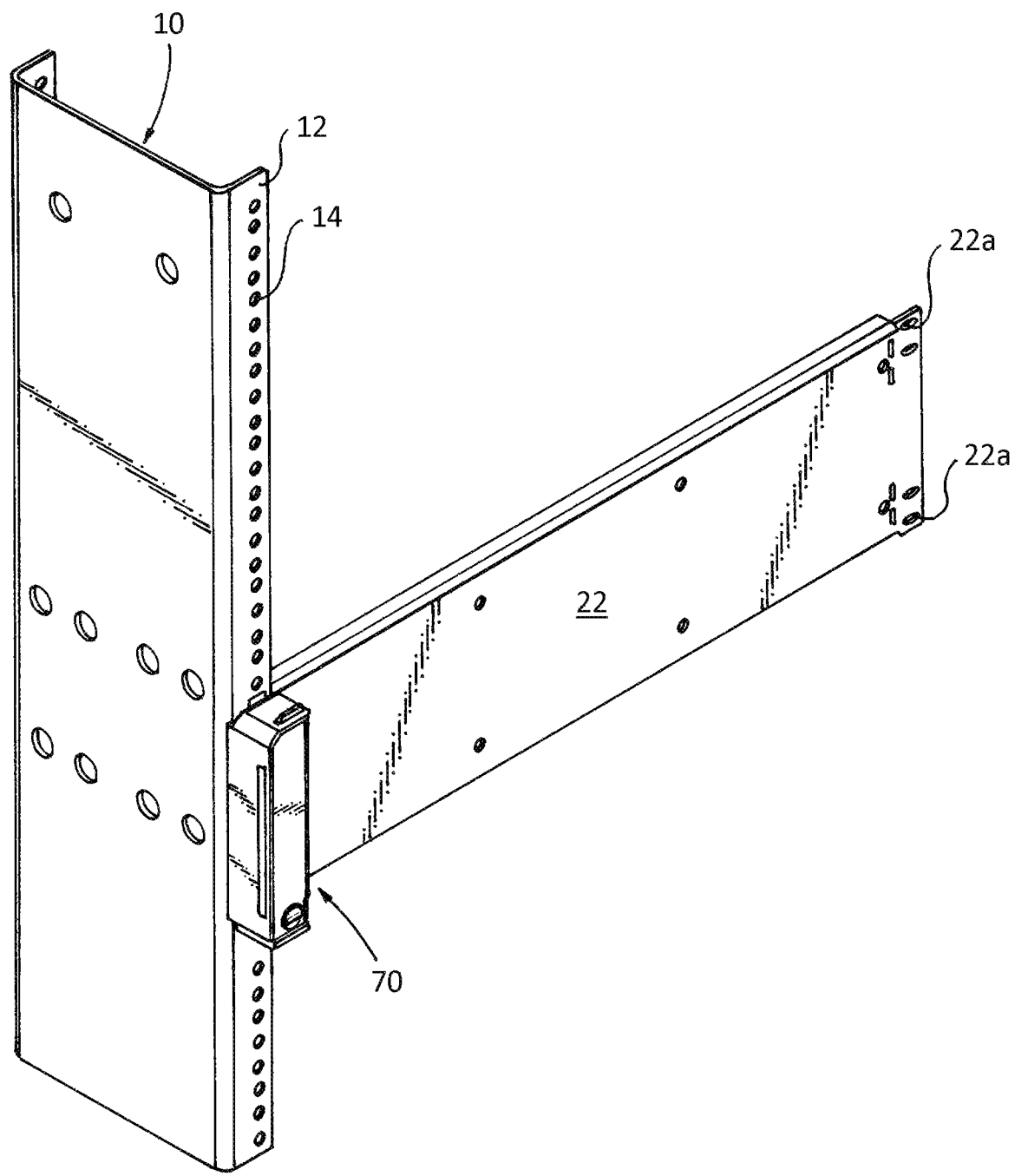
FIG. 21 is a right side perspective view of the lockable cover assembly of FIG. 14 mounted to a mounting structure in a position overlaying a network device.
Figure 22:
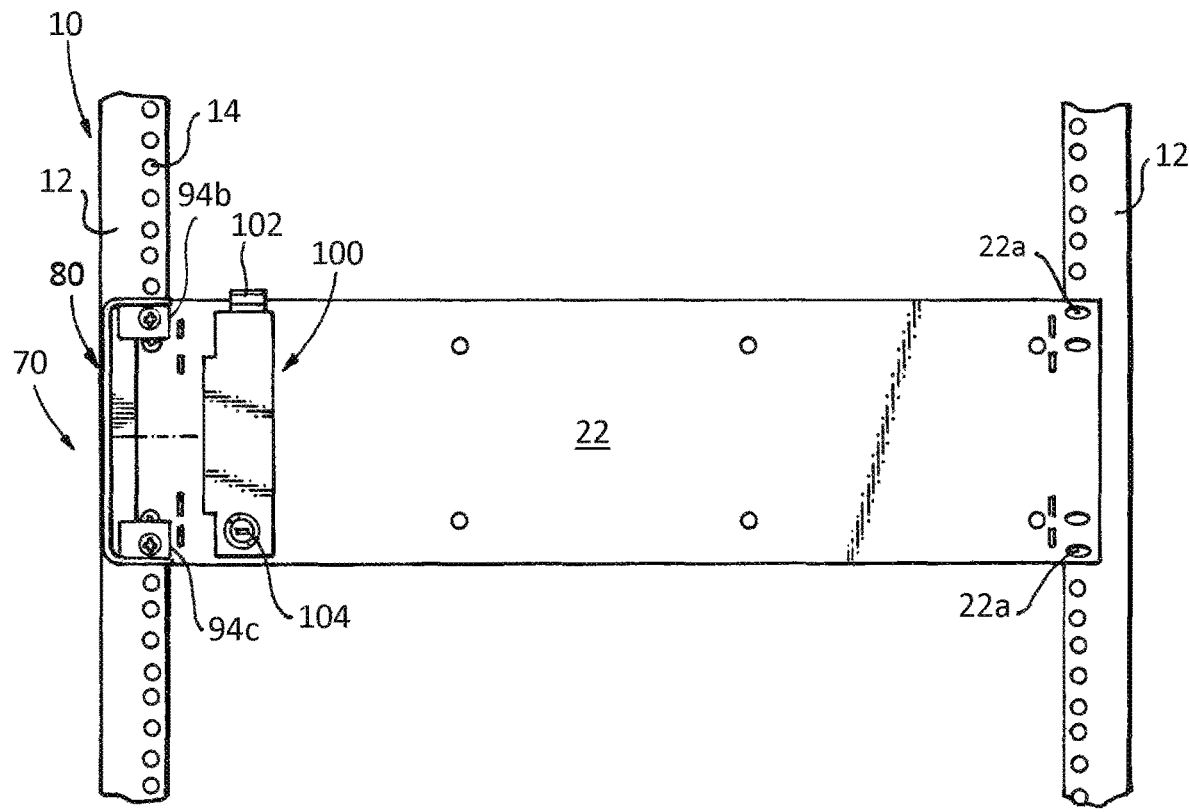
FIG. 22 is a front plan view of the lockable cover assembly of FIG. 14 with the cover in the open position mounted to a mounting structure in a position overlaying a network device.
Figure 23:
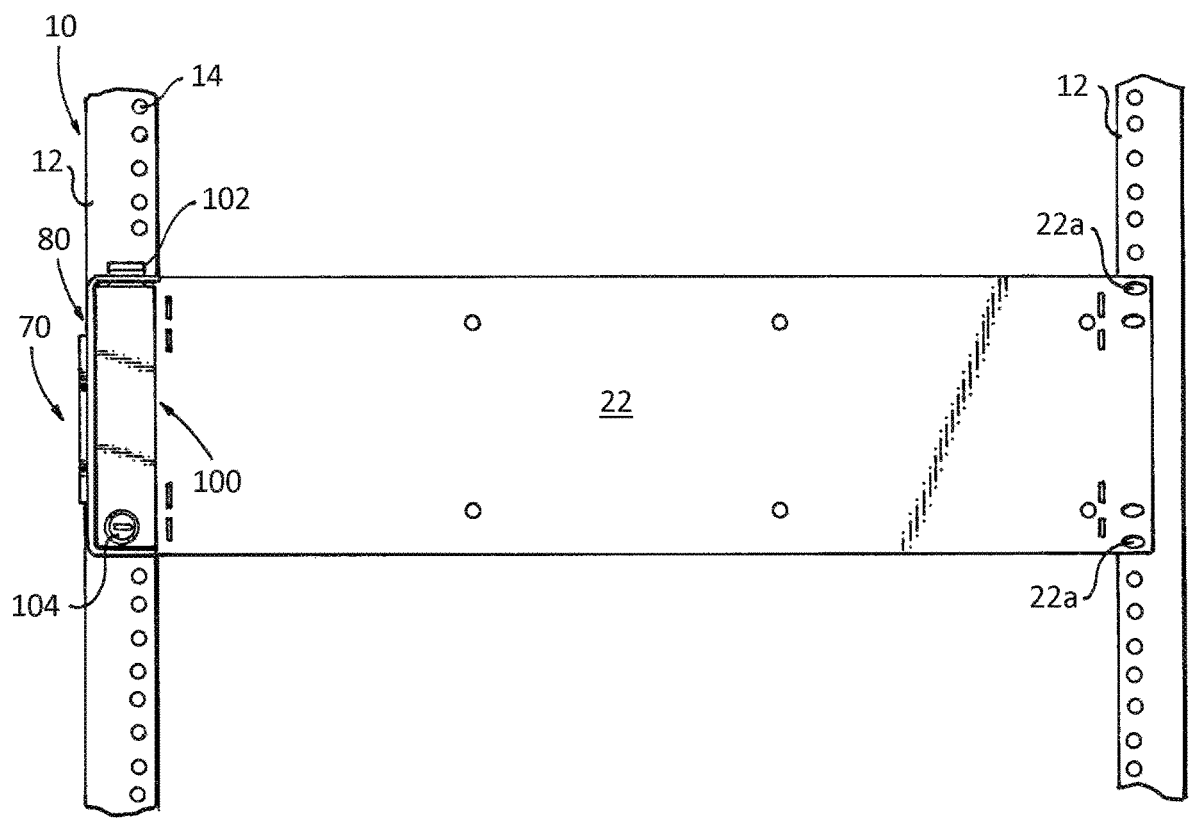
FIG. 23 is a front plan view of the lockable cover assembly of FIG. 14 with the cover in the closed position and mounted to a mounting structure in a position overlaying a network device.

Referring FIGS. 21-23, the lockable cover assembly 70 is configured to cover the mounting fasteners of a single network device. In this configuration, the body 80 of the lockable cover assembly 70 is in an overlay mounting position where the lockable cover assembly 70 sits on top of the network device 22 such that the mounting apertures 98 in rear walls 94b and 94c align with mounting apertures 22a in the network device 22. In FIG. 22, the cover 100 is in an open position. As can be seen, the rear wall sections 94b and 94c sit on top of the network device 22 such that the mounting apertures 98 align with the mounting apertures 22a in the network device. The lockable cover assembly 70 can then be secured to the rack 10 via screws that pass through the apertures 22a and 98 and into threaded holes 14 in the front surface 12 of the rack 10. By pivoting the cover 100 such that hinge arm 102 is positioned within hinge slot 88 in body 80 and then moving (or pivoting) the cover 100 to the closed position (seen in FIG. 23) and locking the lock assembly 104, the screws securing the network device 22 to the rack are covered and not accessible.

Figure 24:
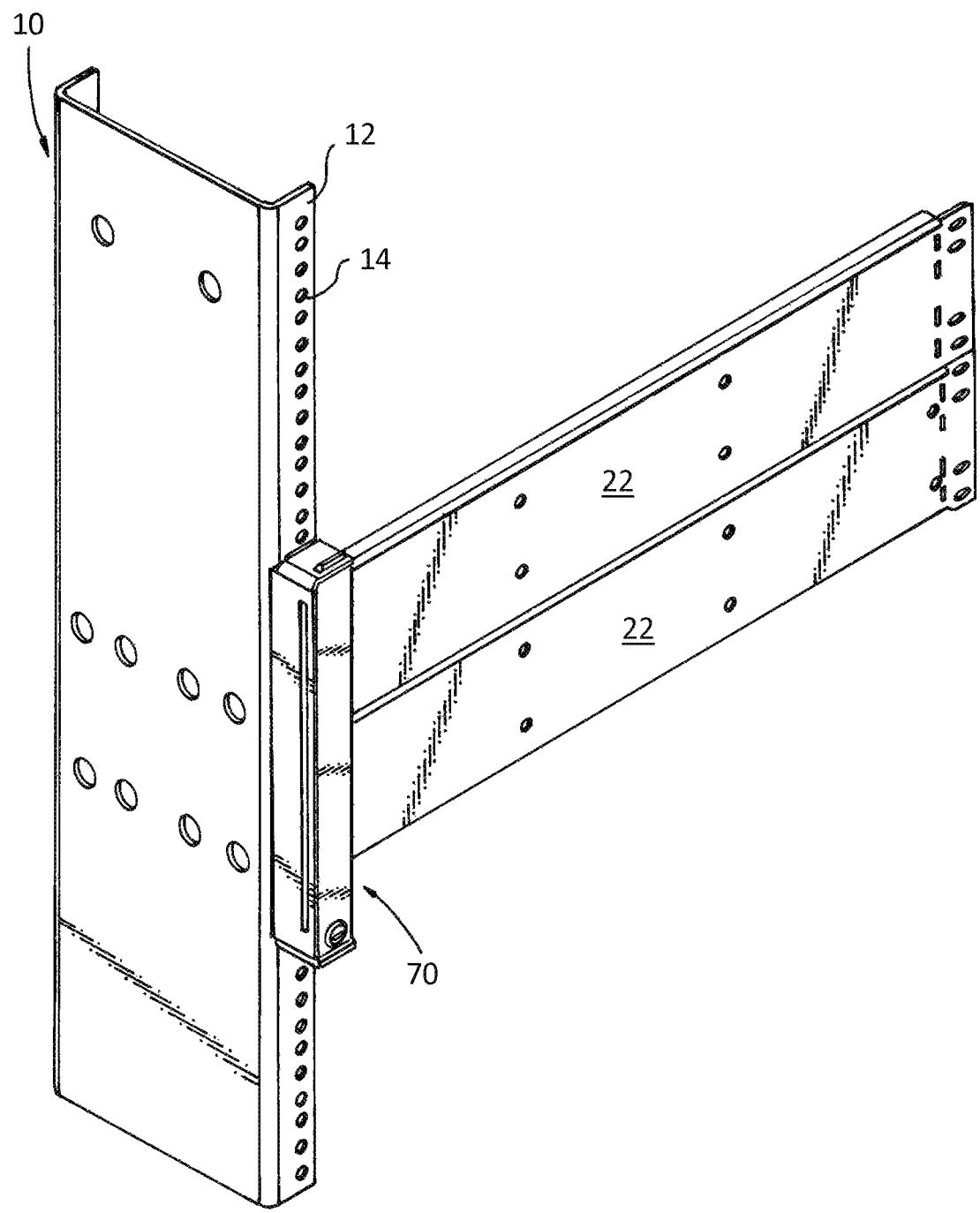
FIG. 24 is a right side perspective view of the lockable cover assembly of FIG. 14 configured for multiple network devices and mounted to a mounting structure in a position straddling the network devices.
Figure 25:
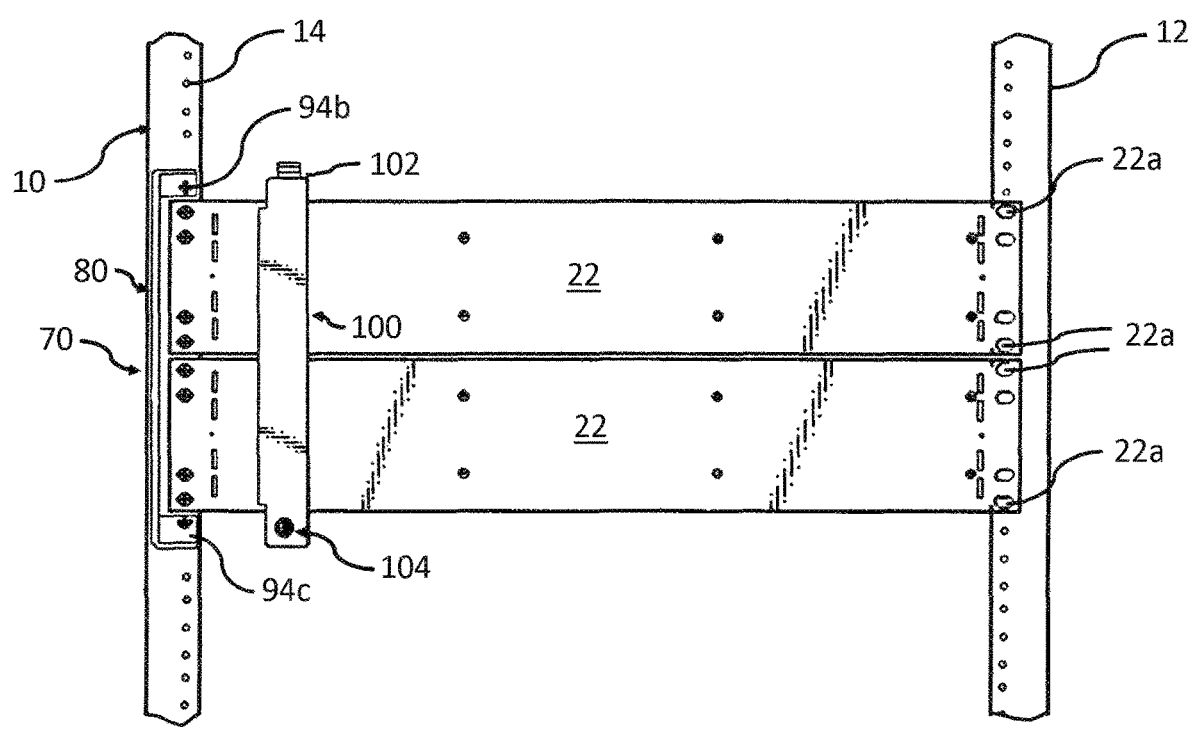
FIG. 25 is a front plan view of the lockable cover assembly of FIG. 14 configured for multiple network devices, with the cover in the closed position and mounted to a mounting structure in a position straddling the network devices.
Figure 26:
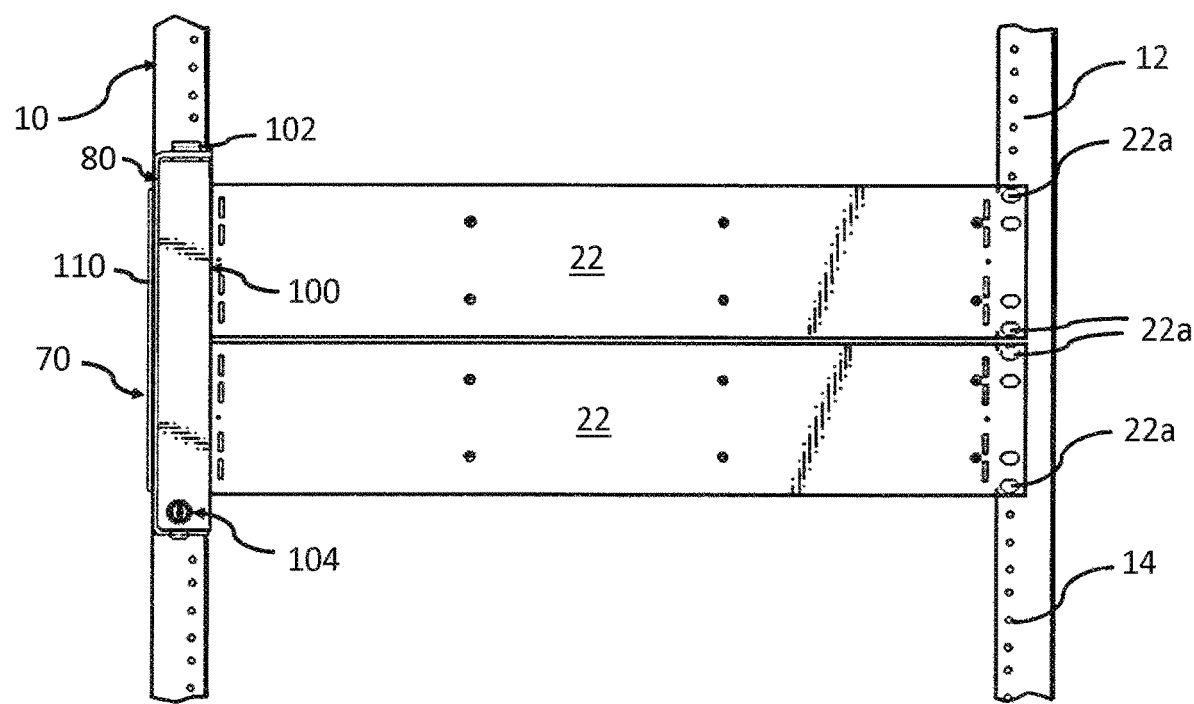
FIG. 26 is a left side perspective view of the lockable cover assembly of FIG. 14 configured for multiple network devices, with the cover in an open position and mounted to a mounting structure in a position straddling multiple network devices.
Figure 27:
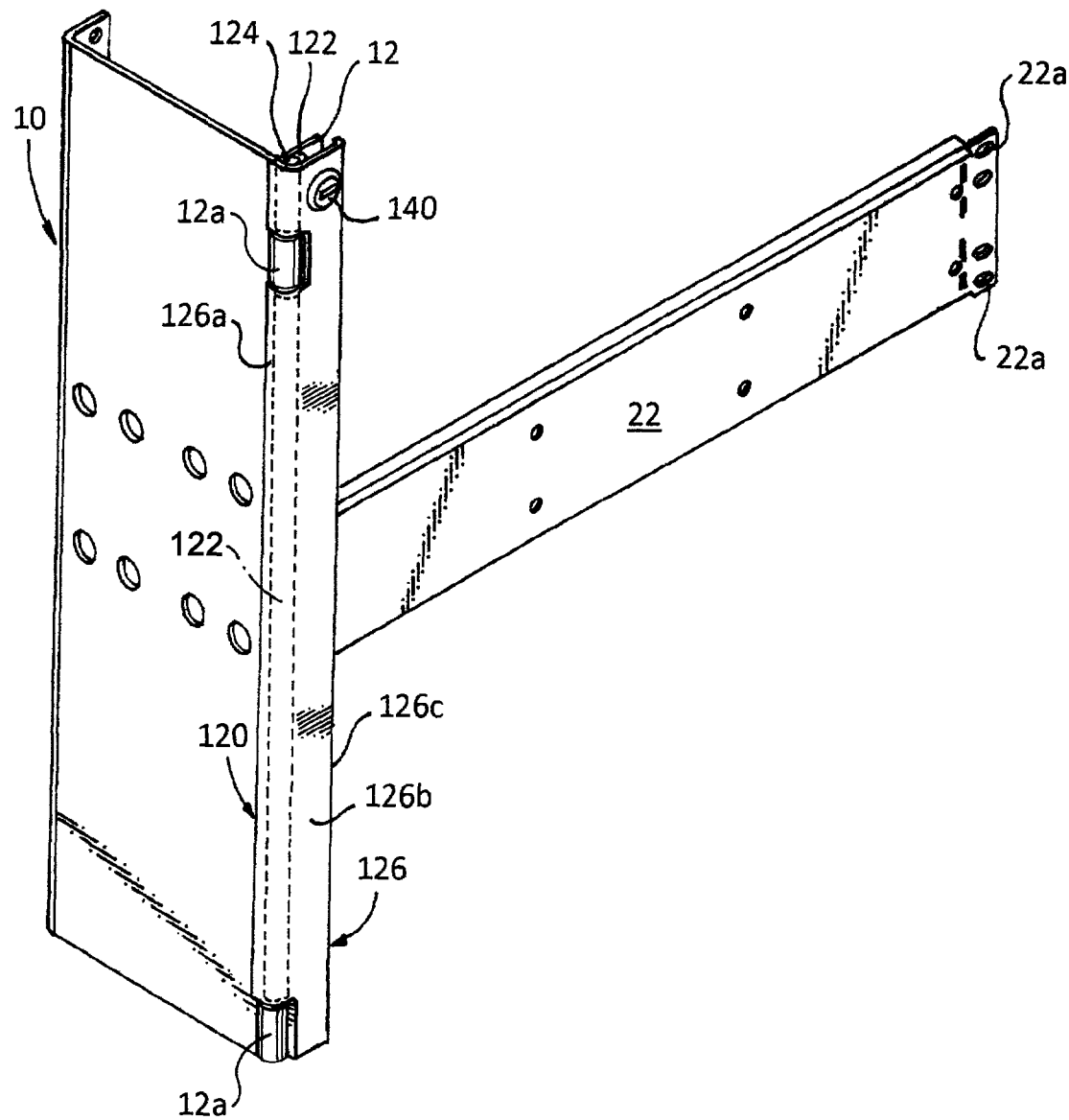
FIG. 27 is a left side perspective view of another exemplary embodiment of a lockable cover assembly according to the present disclosure.
Figure 28:
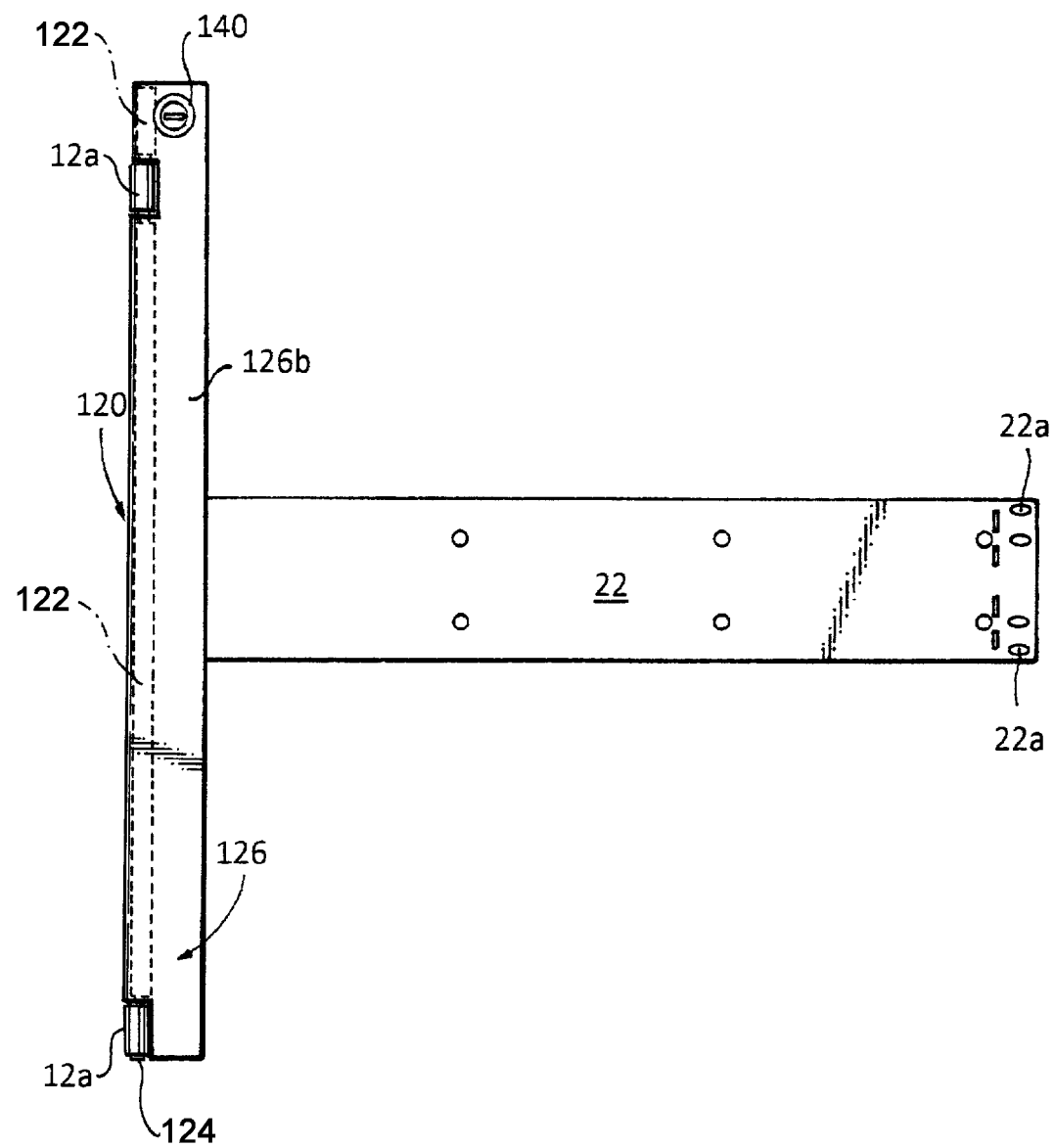
FIG. 28 is a front plan view of the lockable cover assembly of FIG. 27 with a cover in a closed position.
Figure 29:
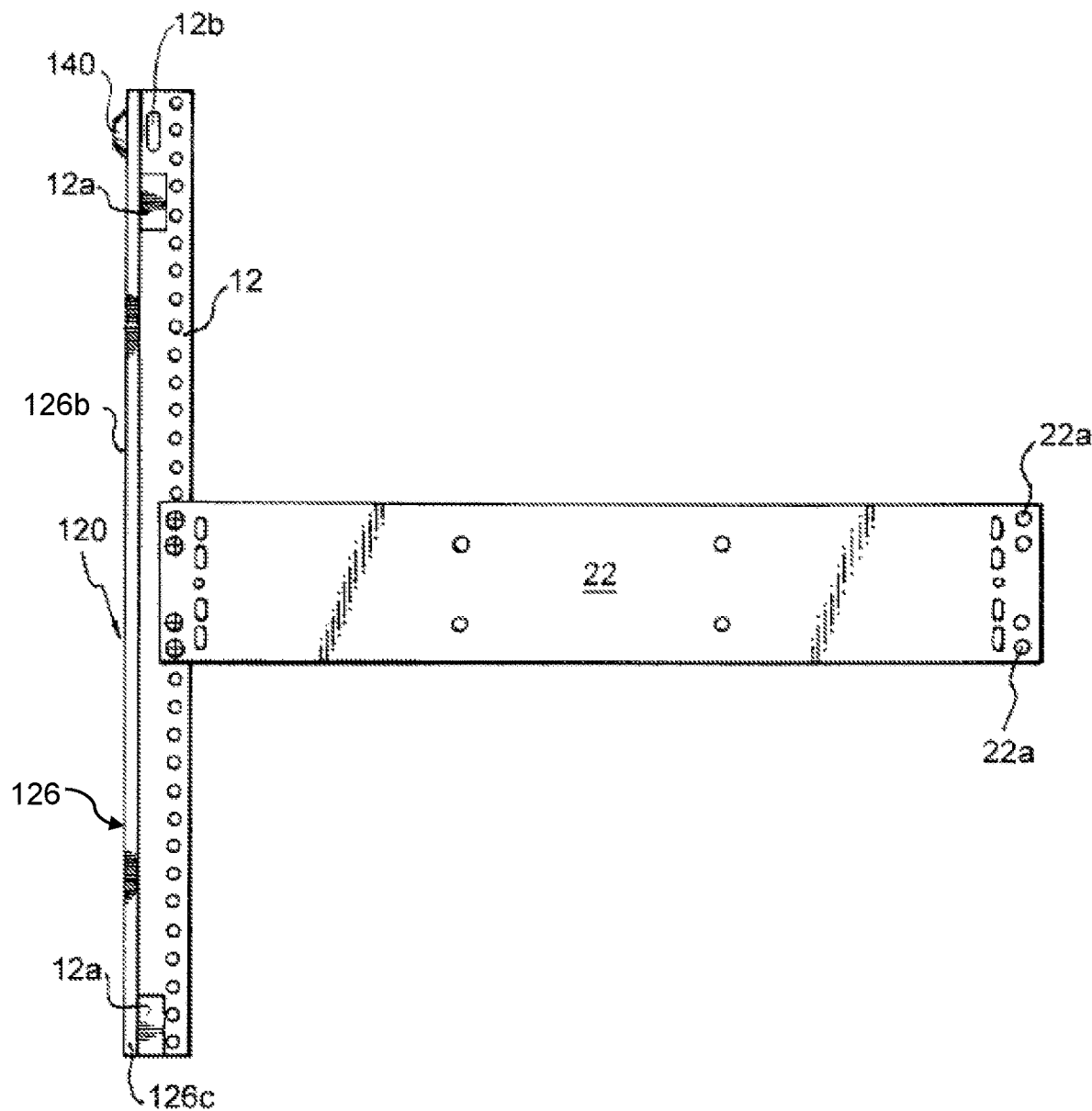
FIG. 29 is a front plan view of the lockable cover assembly of FIG. 27 with a cover in an open position.
Figure 30:
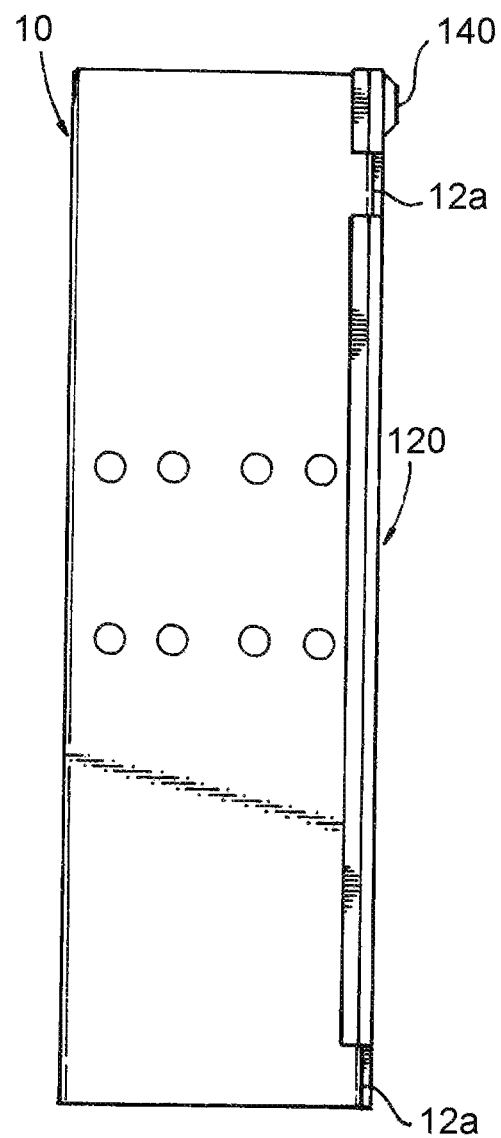
FIG. 30 is a side view of the lockable cover assembly of FIG. 27 with a cover in the closed position.

Referring FIGS. 24-26, the lockable cover assembly 70 is configured to cover the mounting fasteners of multiple network devices 22. In this configuration, the body 80 of the lockable cover assembly 70 is configured for straddle mounting, where the lockable cover assembly 70 sits over and straddles the network devices 22, as seen in FIG. 25. In a straddle mounting position, the mounting apertures 98 align with threaded holes 14 in rack 10. In FIG. 25, the cover 70 is in an open position. As can be seen, the network devices 22 sit within channel 96 of rear wall 94, and the mounting apertures 98 in rear wall sections 94b and 94c align with threaded holes 14 in the rack front 12. The lockable cover assembly 70 can then be secured to the rack 10 via screws that pass through the apertures 98 and into threaded holes 14. In embodiments where the lockable cover assembly 70 is configured for straddle mounting, the channel 96 in the rear wall is configured and dimensioned to receive the mounting surface of one or more network devices 22. By pivoting the cover 100 to the closed position and locking the lock assembly 104, seen in FIG. 26, the screws securing the network device 22 to the rack are covered and not accessible.

The present disclosure also contemplates racks with built in lockable cover assemblies. FIGS. 27-30 show an exemplary embodiment of a rack with a built-in lockable cover assembly. In this exemplary embodiment, the front surface 12 of rack 10 has a lockable cover assembly 120 secured to the rack such that it is movable between an open position (seen in FIG. 29) and a closed position (seen in FIG. 29 28). In this exemplary embodiment, the rack includes one or more hinge pin holders 12a, and the lockable cover assembly includes a cover 126 having a first wall 126a forming one or more wall pin holders 122, a top wall 126b and a second wall 126c, and at least one hinge pin 124 that is capable of fitting within one or more pin holders 12a and one or more wall pin holders 122. The lockable cover assembly 120 also includes a lock assembly 140 that has a lock cylinder 142 and a latch similar to the lock assembly embodiments 60 and 104 shown in FIGS. 4 and 20, respectively, and described above. The lock assembly 140 can be any conventional keyed lock assembly or other type of lock assembly. In the exemplary embodiment shown, the latch (similar to the latches 64 and 108 shown in FIGS. 4 and 20) of lock assembly 140 is positioned on the top wall 126b so that the latch (similar to the latches 64 and 108) can fit within an opening 12b in the front surface 12 of rack 10 and the lock cylinder 142 can be rotated, as is known, so that the latch rotates, as is known, to engage the front surface of the rack 10.

As noted, while the embodiments of the lockable cover assembly of the present disclosure are designed to prevent access to fasteners connecting network devices to a rack when locked, the lockable cover assembly can be used with any other mounting structure, such as rack-mounted enclosures, cabinets and other mounting enclosures used to mount network devices, or within utility boxes used to mount network devices. The lockable cover assemblies may include any number of locking mechanisms to lock the cover. It will be understood that various modifications can be made to the embodiments of the present disclosure herein without departing from the spirit and scope thereof. Therefore, the above description should not be construed as limiting the disclosure, but merely as embodiments thereof. Those skilled in the art will envision other modifications within the scope and spirit of the invention as defined by the claims appended hereto.

What is claimed is:

1. A cover assembly for covering one or more fasteners used to secure at least one network device to a rack, the cover assembly comprising:
   one or more hinge pin holders attachable to a vertical upright of the rack, the vertical upright including a side wall and a front surface extending substantially perpendicular to the side wall, the front surface having a horizontal width; and
   a generally planar cover having a vertical length that is substantially the same as a vertical length of the vertical upright and a horizontal width that is substantially the same as the horizontal width of the front surface, the cover having one or more wall pin holders coupled to the one or more hinge pin holders such that the cover is movable between an open position providing access to the one or more fasteners and a closed position covering the one or more fasteners, the cover having a locking assembly capable of engaging a portion of the front surface to lock the cover to the vertical upright.

2. The cover assembly according to claim 1, further comprising at least one hinge pin positioned within the one or more hinge pin holders and the one or more wall pin holders, so as to releasably couple the cover to the vertical upright.

3. A rack having a lockable cover assembly for covering one or more fasteners used to secure at least one network device to the rack, comprising:
   a plurality of spaced apart front vertical uprights, each front vertical upright including a side wall and a front surface having a horizontal width that is capable of having the at least one network device mounted thereto, wherein at least one of the plurality of front vertical uprights has one or more hinge pin holders attached to a corresponding front surface; and
   a generally planar cover having a vertical length that is substantially the same as a vertical length of the at least one vertical upright having the one or more hinge pin holders and a horizontal width that is substantially the same as the horizontal width of the corresponding front surface of the at least one vertical upright having the one or more hinge pin holders, the cover having one or more wall pin holders coupled to the one or more hinge pin holders such that the cover is movable between an open position providing access to the one or more fasteners and a closed position covering the one or more fasteners, and the cover having a locking assembly capable of engaging a portion of the corresponding front surface of the at least one vertical upright having the one or more hinge pin holders to lock the cover to the rack.

4. The rack according to claim 3, wherein the corresponding front surface includes one or more apertures to receive the one or more fasteners.

5. The rack according to claim 3, further comprising at least one hinge pin positioned within the one or more hinge pin holders and the one or more wall pin holders, so as to releasably couple the cover to the at least one vertical upright having the one or more hinge pin holders.

6. A cover assembly for covering one or more fasteners used to secure a plurality of network devices to a rack, the cover assembly comprising:
   one or more hinge pin holders attachable to a vertical upright of the rack, the vertical upright having a vertical length configured to secure a plurality of network devices thereto, a side wall and a front surface extending substantially perpendicular to the side wall, the front surface having a horizontal width, and a plurality of mounting apertures used to secure the plurality of network devices to the vertical upright; and
   a generally planar cover having a vertical length that is substantially the same as a vertical length of the vertical upright and a horizontal width that is substantially the same as the horizontal width of the front surface, the cover having one or more wall pin holders coupled to the one or more hinge pin holders such that the cover is movable between an open position providing access to the one or more fasteners and a closed position covering the one or more fasteners, and the cover having a locking assembly capable of engaging a portion of the front surface to lock the cover to the vertical upright.

7. The cover assembly according to claim 6, wherein the horizontal width of the cover is configured to cover the plurality of mounting apertures.

8. The cover assembly according to claim 6, further comprising at least one hinge pin positioned within the one or more hinge pin holders and the one or more wall pin holders so as to releasably couple the cover to the vertical upright.

\* \* \* \* \*